United States Patent
Masuoka et al.

(10) Patent No.: US 7,388,245 B2
(45) Date of Patent: Jun. 17, 2008

(54) SEMICONDUCTOR DEVICE, METHOD FOR MANUFACTURING THE SEMICONDUCTOR DEVICE AND PORTABLE ELECTRONIC DEVICE PROVIDED WITH THE SEMICONDUCTOR DEVICE

(75) Inventors: Fujio Masuoka, 9-14-901, Hachiman 3-chome, Aoba-ku, Sendai-shi, Miyagi (JP) 980-0871; Takashi Yokoyama, Hiroshima (JP); Takuji Tanigami, Nara (JP); Shinji Horii, Hiroshima (JP)

(73) Assignees: Fujio Masuoka, Miyagi (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/592,034

(22) PCT Filed: Mar. 7, 2005

(86) PCT No.: PCT/JP2005/003906

§ 371 (c)(1),
(2), (4) Date: May 21, 2007

(87) PCT Pub. No.: WO2005/088703

PCT Pub. Date: Sep. 22, 2005

(65) Prior Publication Data

US 2007/0278625 A1 Dec. 6, 2007

(30) Foreign Application Priority Data

Mar. 10, 2004 (JP) ............................... 2004-067644

(51) Int. Cl.
*H01L 29/423* (2006.01)

(52) U.S. Cl. ................... 257/302; 257/330; 257/331; 257/E21.211; 257/E29.309; 257/E29.131; 438/156; 438/157; 438/164

(58) Field of Classification Search ............... 257/316, 257/329, 330, 331, 332, 353, E21.211, E21.422, 257/E21.693, E29.309, E29.131; 438/156, 438/157, 164
See application file for complete search history.

(56) References Cited

U.S. PATENT DOCUMENTS 5,252,845 A * 10/1993 Kim et al. ................. 257/302

(Continued)

FOREIGN PATENT DOCUMENTS

| JP | 10-079482 A | 3/1998 |
| JP | 2003-007866 A | 1/2003 |
| JP | 2003-068885 A | 3/2003 |

OTHER PUBLICATIONS

International Search Report mailed on Jun. 7, 2005 for PCT Application No. PCT/JP2005/003906 filed on Mar. 7, 2005, two pages.

*Primary Examiner*—Evan Pert
*Assistant Examiner*—Victor A. Mandala, Jr.
(74) *Attorney, Agent, or Firm*—Morrison & Foerster LLP

(57) ABSTRACT

A semiconductor device, which is characterized by that two or more island-shaped semiconductor layers including first and second island-shaped semiconductor layers are formed on the same substrate, at least the first island-shaped semiconductor layer has steps in its side wall so that sectional area of a cross section parallel to the surface of the substrate varies stepwise with respect to height in the vertical direction, the second island-shaped semiconductor layer is different from the first island-shaped semiconductor layer with respect to the presence/absence of a step in the side wall or the number of steps, and each of the first and second island-shaped semiconductor layers provides an element on a stair part of the side wall divided by the steps or on the side wall having no steps.

11 Claims, 38 Drawing Sheets

U.S. PATENT DOCUMENTS

| | | | |
|---|---|---|---|
| 5,414,287 A * | 5/1995 | Hong | 257/316 |
| 6,444,525 B1 * | 9/2002 | Lee | 438/259 |
| 6,649,477 B2 * | 11/2003 | Blanchard et al. | 438/268 |
| 6,727,544 B2 * | 4/2004 | Endoh et al. | 257/315 |
| 6,852,597 B2 * | 2/2005 | Park et al. | 438/268 |
| 6,933,556 B2 * | 8/2005 | Endoh et al. | 257/315 |
| 7,061,038 B2 * | 6/2006 | Endoh et al. | 257/300 |
| 7,135,726 B2 * | 11/2006 | Endoh et al. | 257/296 |
| 7,256,454 B2 * | 8/2007 | Yater et al. | 257/331 |
| 7,304,347 B2 * | 12/2007 | Blanchard et al. | 257/327 |
| 2002/0195668 A1 | 12/2002 | Endo et al. | |
| 2003/0157763 A1 | 8/2003 | Endo et al. | |

* cited by examiner

SEMICONDUCTOR DEVICE, METHOD FOR MANUFACTURING THE SEMICONDUCTOR DEVICE AND PORTABLE ELECTRONIC DEVICE PROVIDED WITH THE SEMICONDUCTOR DEVICE

CROSS-REFERENCE TO RELATED APPLICATIONS

This application is a National Phase filing under 35 U.S.C. § 371 of International Application No. PCT/JP2005/003906 filed on Mar. 7, 2005, and which claims priority to Japanese Patent Application No. 2004-067644 filed on Mar. 10, 2004.

TECHNICAL FIELD

The present invention relates to a semiconductor device, a method for manufacturing the same, and a portable electronic device having the same. More specifically, the invention relates to a semiconductor device in which a plurality of kinds of elements are formed on a side wall having steps of an island-shaped semiconductor layer, and a portable electronic device having the semiconductor device.

BACKGROUND ART

With improvement in the semiconductor technology, especially, microfabrication technology in recent years, miniaturization and increase in capacity of a transistor and a memory cell are rapidly advancing. As one of methods for simultaneously realizing miniaturization and capacity increase, an EEPROM has been proposed, in which lattice-shaped grooves are formed in the surface of a semiconductor substrate, thereby forming a plurality of island-shaped semiconductor layers arranged in a matrix and separated from each other, and memory cells are formed by using side walls of the island-shaped semiconductor layers (for example, refer to Japanese Unexamined Patent Publication No. 2003-068885).

FIG. 38 is a cross section showing the structure of an island-shaped semiconductor layer formed in the EEPROM. As shown in FIG. 38, the sectional shape in the direction perpendicular to the surface of the semiconductor substrate, of an island-shaped semiconductor layer 110 made by silicon is a step-like shape. In parts of the side wall divided by steps of the island-shaped semiconductor layer 110, memory cells each having a charge storage layer 510 and a control gate 520 are disposed adjacent to each other. Further, selection transistors each having a selection gate 500 are disposed on the side wall of the island-shaped semiconductor layer 110 so as to sandwich the memory cells in the vertical direction, thereby forming a memory unit.

In the EEPROM, the island-shaped semiconductor layers 110 each having such a shape are disposed in a matrix, and memory units each having the above-described structure are connected in an array to form a memory array.

DISCLOSURE OF THE INVENTION

Problems to be Solved by the Invention

In the EEPROM, all of stepwise side walls of the island-shaped semiconductor layers have the same shape. However, if all of the side walls of the island-shaped semiconductor layers in the EEPROM have to have the same shape, the shape and the configuration of a transistor and a memory cell formed in the EEPROM, or the circuit configuration of a memory unit may be limited. Consequently, a semiconductor device including a plurality of kinds of columnar semiconductor layers having side walls of different shapes as desired is demanded.

Further, for example, also in a conventional semiconductor device, that is, a semiconductor device in which all of side walls have the same step shape, in order to precisely evaluate characteristics of an oxide film formed on the side wall of the island-shaped semiconductor layer, it is preferable to make an evaluation in such a manner that an island-shaped semiconductor layer having no steps is also formed in the same substrate so as not to consider the influence of the steps.

The present invention has been achieved in view of such circumstances and an object of the invention is to provide a semiconductor device including island-shaped semiconductor layers of a plurality of shapes in which the shapes of side walls of the island-shaped semiconductor layers (the number of steps of side walls or the presence/absence of the steps) are different from each other, a method of manufacturing the semiconductor device, and a portable electronic device having the semiconductor device.

Means of Solving the Problems

The present invention provides a semiconductor device which is characterized by that two or more island-shaped semiconductor layers including first and second island-shaped semiconductor layers are formed on the same substrate, at least the first island-shaped semiconductor layer has steps in its side wall so that sectional area of a cross section parallel to the surface of the substrate varies stepwise with respect to height in the vertical direction, the second island-shaped semiconductor layer is different from the first island-shaped semiconductor layer with respect to the presence/absence of a step in the side wall or the number of steps, and each of the first and second island-shaped semiconductor layers provides an element on a stair part of the side wall divided by the steps or on the side wall having no steps.

EFFECT OF THE INVENTION

In the semiconductor device according to the invention, the first and second island-shaped semiconductor layers are different from each other with respect to the presence/absence of a step in the side wall or the number of steps. Consequently, various kinds of elements can be formed on the side walls without being limited by the shapes of the side walls. Thus, a semiconductor device having a high degree of freedom in configuration can be obtained.

Also in the case of forming a TEG (Test Element Group), that is, a semiconductor chip for evaluating a single element is made and making an element evaluation, the evaluation can be performed by using the semiconductor device of the invention.

Figure 1:
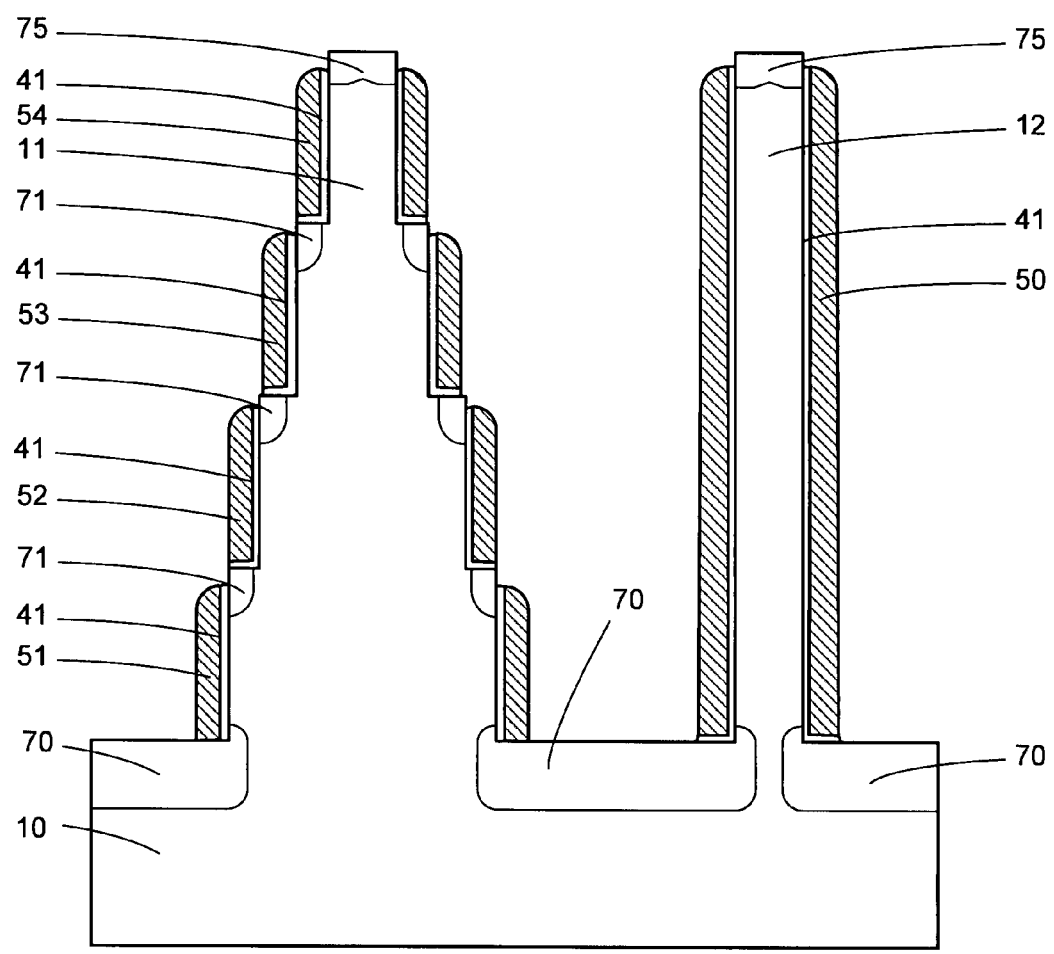
FIG. 1 is a cross section showing an example of the structure of a semiconductor device according to the present invention (first embodiment).

EXPLANATIONS OF LETTERS OR NUMERALS 10, 100 P-TYPE SEMICONDUCTOR SUBSTRATE
11, 12, 110 ISLAND-SHAPED SEMICONDUCTOR LAYER
31, 32, 33 SILICON NITRIDE FILM
41, 42, 43, 440, 460, 480 SILICON OXIDE FILM
50, 51, 52, 53, 54, 55, 56, 500, 510, 520, 530 POLYSILICON FILM
610 INTERLAYER INSULATION FILM
70, 71, 75, 710, 720, 725 N-TYPE IMPURITY DIFFUSION LAYER
804, WIRING LAYER
R1, R2, R3, R4, R5 RESIST
900 CELLULAR PHONE
901 CONTROL CIRCUIT SECTION
902 COMPUTING SECTION
903 CONTROL SECTION
904 DATA MEMORY SECTION
905 ROM
906 RAM
907 LINES
908 MAN-MACHINE INTERFACE SECTION
910 RF (RADIO FREQUENCY) CIRCUIT SECTION
911 ANTENNA SECTION

BEST MODE FOR CARRYING OUT THE INVENTION

A semiconductor device of the present invention is characterized in that two or more island-shaped semiconductor layers including the first and the second island-shaped semiconductor layers are formed on the same substrate, each of the first and second island-shaped semiconductor layers provides an element on the stair part of a side wall divided by the steps or on a side wall having no steps, and the first and second island-shaped semiconductor layers are different from each other with respect to the presence/absence of a step in the side wall or the number of steps.

Here, the step in the side wall is a portion formed in the island-shaped semiconductor layer across which, as a boundary, the sectional areas of the sections parallel with the substrate of the island-shaped semiconductor layer are different from each other, and the step is in a plane apart from the substrate surface only a predetermined distance. The step may be a region having a certain width from the viewpoint of process accuracy. The side wall divided by the step refers to a side wall other than the step. The side wall extends almost straight in a direction perpendicular to the substrate surface. Both ends of the side wall are divided by either the step, the top of the island-shaped semiconductor layer, or the bottom of a groove between island-shaped semiconductor layers. The step and the side wall divided by the step exist in the entire periphery of the island-shaped semiconductor layer. Elements are formed entirely or partly on the side wall divided by a step or the side wall having no steps, but a single element spreading across the step is not formed.

A plurality of island-shaped semiconductor layers having the same shapes as that/those of the first island-shaped semiconductor layer and/or the second island-shaped semiconductor layer may be formed in a semiconductor device.

A semiconductor device of the present invention is characterized in that two or more island-shaped semiconductor layers including first and second island-shaped semiconductor layers are formed on the same substrate, at least the first island-shaped semiconductor layer has steps in its side wall so that sectional area of a cross section parallel to the surface of the substrate varies stepwise with respect to height in the vertical direction, the height of the first island-shaped semiconductor layer and that of the second island-shaped semiconductor layer are different from each other, and each of the first and second island-shaped semiconductor layers provides an element on a stair part of the side wall divided by the steps or on the side wall having no steps.

Here, the height of the side wall is a total length of the region(s) in which elements are formed and the step(s) in the side wall of each island-shaped semiconductor layer in a direction perpendicular to the substrate surface.

According to the invention, since the height of the first island-shaped semiconductor layer and that of the second island-shaped semiconductor layer are different from each other, various kinds of elements can be formed on the side walls without being restricted to the shape of the side walls. Thus, a semiconductor device having a high degree of freedom in configuration can be obtained.

A combination of elements provided on the side wall of the first island-shaped semiconductor layer may be different from an element or a combination of elements provided on the side wall of the second island-shaped semiconductor layer. With the configuration, various kinds of elements or a combination of the various kinds of elements can be provided in a single semiconductor device. Thus, a semiconductor device having a high degree of freedom in designing can be obtained.

The element may be a transistor having, as a gate electrode, an electrode formed to surround entirely or partly the side wall of the first or second island-shaped semiconductor layer, a capacitor using the electrode as one of electrodes and using an impurity diffusion layer formed on the side wall across an insulation film as the other electrode, or a memory cell having a charge storage layer and a control gate formed to surround entirely or partly on the side wall of the first or second island-shaped semiconductor layer.

In the semiconductor device according to the invention, the substrate and the first and second island-shaped semiconductor layers include a first region of a first conductive type and a second region made by an impurity diffusion layer of a second conductive type formed at least in a part of the substrate surface, and the element may be electrically insulated from the substrate by a depletion layer formed in a joint part between the substrate and the island-shaped semiconductor layer by applying a voltage across the first and second regions.

With such a configuration, each of the elements are electrically insulated from the substrate, so that a semiconductor device including elements having an excellent electric characteristic can be obtained.

According to another aspect, the invention also provides a method for manufacturing a semiconductor device including at least a first island-shaped semiconductor layer having steps in its side wall, and a second island-shaped semiconductor layer having no steps in its side wall or having step(s) of the number smaller than that in the first island-shaped semiconductor layer, the first and second island-shaped semiconductor layers being formed on the same substrate. The method is characterized by including at least: a sidewall forming step for forming a sidewall on the side wall of each of the first and second island-shaped semiconductor layers; a sidewall removing step for removing the sidewall on the second island-shaped semiconductor layer prior to the following step in the case of forming no steps in the side wall; and an etching step for: etching the substrate only by a predetermined depth by using, as a mask, the sidewall which is provided at least on the side wall of the first island-shaped semiconductor layer to form a new side wall having a step with respect to the already-formed side wall on the first island-shaped semiconductor layer, and to form a new side wall having a step or no steps with respect to the already-formed side wall in accordance with the presence or absence of the sidewall on the second island-shaped semiconductor layer.

In such method, since the semiconductor device manufacturing method of the invention includes the sidewall forming step, the sidewall removing step and the etching step, an island-shaped semiconductor layer having a step in its side wall and an island-shaped semiconductor layer having no steps can be formed simultaneously. Consequently, the number of processes and required time can be reduced as compared with the manufacturing method of forming steps in side walls of island-shaped semiconductor layers in independent steps. Therefore, the semiconductor device can be manufactured more cheaply than the conventional manufacturing method.

The manufacturing method may further include: a step for etching the substrate surface other than the first and second island-shaped semiconductor layers only by a predetermined depth to form the uppermost side wall of the first island-shaped semiconductor layer and to form a side wall of the second island-shaped semiconductor layer corresponding to the uppermost side wall; a step, after the above mentioned step, for repeating the sidewall forming step, the sidewall removing step, and the etching step in succession only by a predetermined number of times until the predetermined number of steps are formed in the first island-shaped semiconductor layer; and a step for forming an element on a stair part of the side wall divided by the steps or on the side wall having no steps, the side wall being located on each of the island-shaped semiconductor layers. By the method, a first island-shaped semiconductor layer having a predetermined number of steps in its side wall, and a second island-shaped semiconductor layer having no steps in its side wall or having step(s) of the number smaller than that in the first island-shaped semiconductor layer may be formed.

In such a manner, island-shaped semiconductor layers which are different from one another with respect to the presence/absence of a step in the side walls or the number of steps can be simultaneously formed on the substrate.

The manufacturing method may further include: a step for etching the substrate surface other than the first and second island-shaped semiconductor layers only by a predetermined depth to form the uppermost side wall of the first island-shaped semiconductor layer and a side wall of the second island-shaped semiconductor layer corresponding to the side wall; a step, in the case where height of the second island-shaped semiconductor layer does not reach a predetermined height after the above mentioned step, for repeating the sidewall forming step, the sidewall removing step, and the etching step until the height of the second island-shaped semiconductor layer reaches the predetermined height; a second sidewall forming step for forming another sidewall on the side wall of each of the first and second island-shaped semiconductor layers; a resist covering step for covering with a resist the second island-shaped semiconductor layer and an region in the substrate surface including the second island-shaped semiconductor layer; a second etching step for further etching the substrate only by a predetermined depth using, as a mask, the sidewall provided on the side wall of the first island-shaped semiconductor layer and the resist to form a new side wall having a step with respect to the already formed side wall on the first island-shaped semiconductor layer, but not etching the region which is covered with the resist and which includes the second island-shaped semiconductor layer; a step, in the case where the number of steps in the side wall of the first island-shaped semiconductor layer does not reach a predetermined number after the second etching step, for repeating the second sidewall forming step and the second etching step until the number of steps reaches the predetermined number of steps; and a step for forming an element on a stair part of the side wall divided by the steps in each of the island-shaped semiconductor layers or on the side wall having no steps, so that a first island-shaped semiconductor layer having a predetermined number of steps in its side wall, and a second island-shaped semiconductor layer having no steps in its side wall or having step(s) of the number smaller than that in the first island-shaped semiconductor layer are formed.

In such a manner, in such a manner, island-shaped semiconductor layers having different heights can be simultaneously formed on the substrate.

The resist covering step may be performed prior to the second sidewall forming step.

By removing the sidewall on the second island-shaped semiconductor layer in all of the sidewall removing steps, the side wall having no steps may be formed on the second island-shaped semiconductor layer.

Alternatively, by not removing the sidewall on the second island-shaped semiconductor layer in at least one of the sidewall removing steps, the side wall having step(s) of the number smaller than that in the first island-shaped semiconductor layer may be formed on the second island-shaped semiconductor layer.

The invention will be described in detailed hereinbelow on the basis of embodiments shown in the drawings.

First Embodiment

Example of Structure of Semiconductor Device

FIG. 1 is a cross section showing an example of the structure of a semiconductor device of the present invention. As shown in FIG. 1, on the surface of a semiconductor substrate 10, a first island-shaped semiconductor layer 11 and a second island-shaped semiconductor layer 12 whose sectional shapes in the direction perpendicular to the surface are different from each other are formed. On the side wall of each of the first and second semiconductor layers, transistor elements are formed. To simplify the drawing, wires for applying voltage from the outside to the elements are not shown. As long as island-shaped semiconductor layers whose shapes are different from one another are formed on a substrate, the shapes of the island-shaped semiconductor layers are not limited. The number of island-shaped semiconductor layers is not also limited to two as shown in FIG. 1. In a practical semiconductor device, a number of island-shaped semiconductors are formed.

Figure 2:
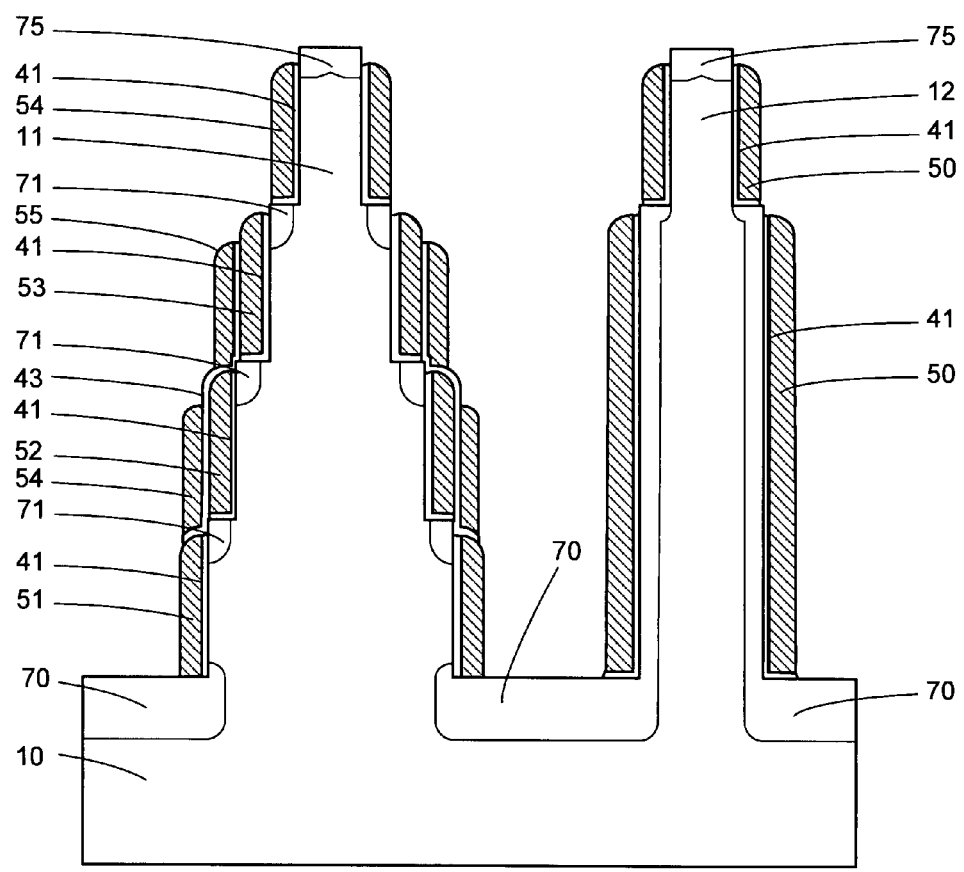
FIG. 2 is a cross section showing another example of the structure of the semiconductor device according to the invention (first embodiment).
Figure 38:
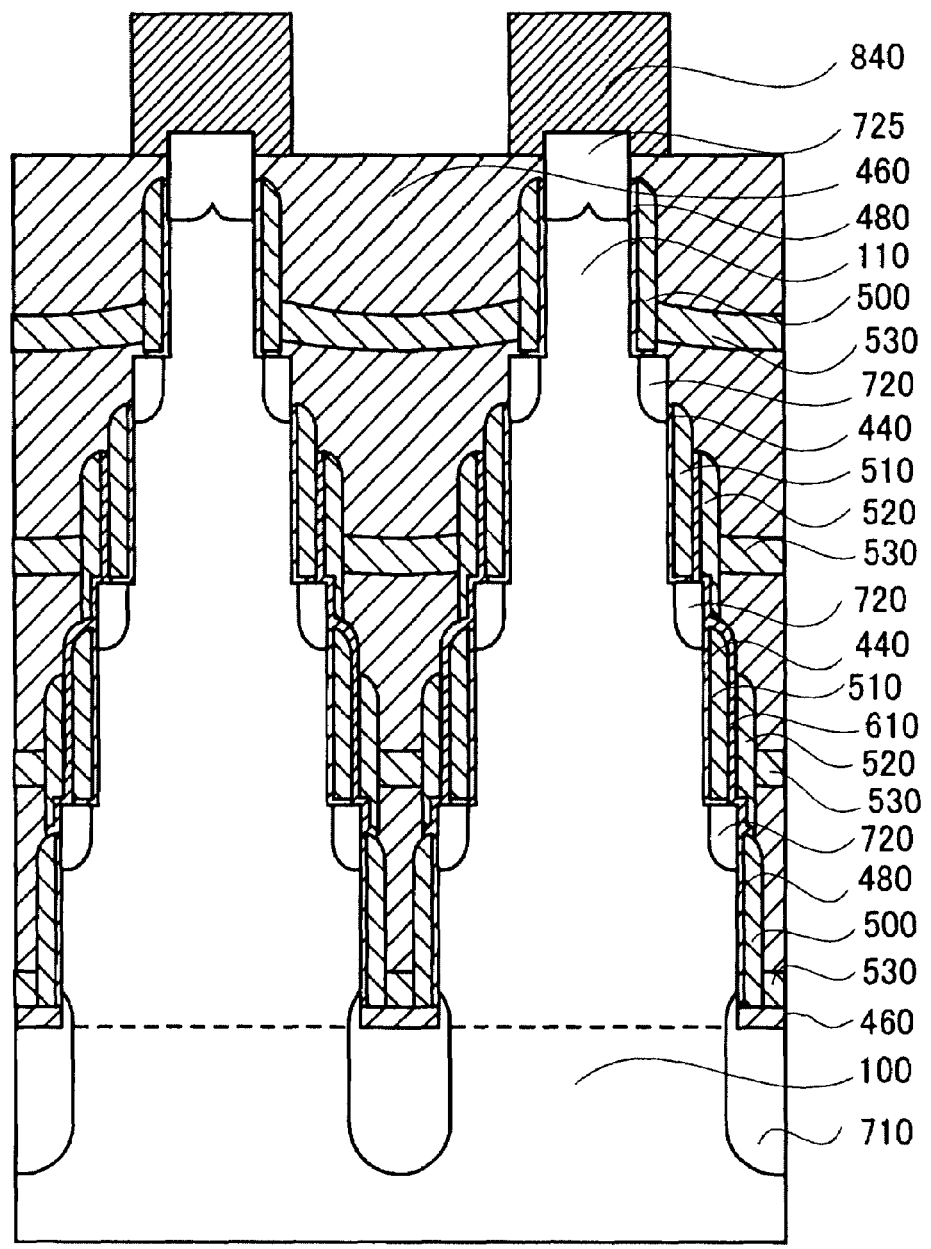
FIG. 38 is a cross section showing the structure of an island-shaped semiconductor layer formed in a conventional EEPROM.

Elements formed on the side walls of the island-shaped semiconductor layer may be transistors as shown in FIG. 1 but are not limited to transistors. The elements may be, for example, memory cells such as flash memory elements or MNOS, or capacitors. FIG. 2 is a cross section showing another example of the structure of the semiconductor device of the present invention. In FIG. 2, a flash memory unit is formed on the side wall of the first island-shaped semiconductor layer 11. The flash memory unit is similar to that formed on the side wall of the island-shaped semiconductor layer 110 in the semiconductor device shown in FIG. 38. In the flash memory, selection transistors are disposed on upper and lower sides of a flash memory cell having a charge storage layer and a gate electrode. A transistor is formed in the upper part of the side wall of the second island-shaped semiconductor layer 12, and a capacitor is formed in the lower part of the side wall.

An impurity diffusion layer 71 in the island-shaped semiconductor layers are formed as a source and a drain of a transistor or a memory cell, or formed to electrically connect elements.

Figure 36:
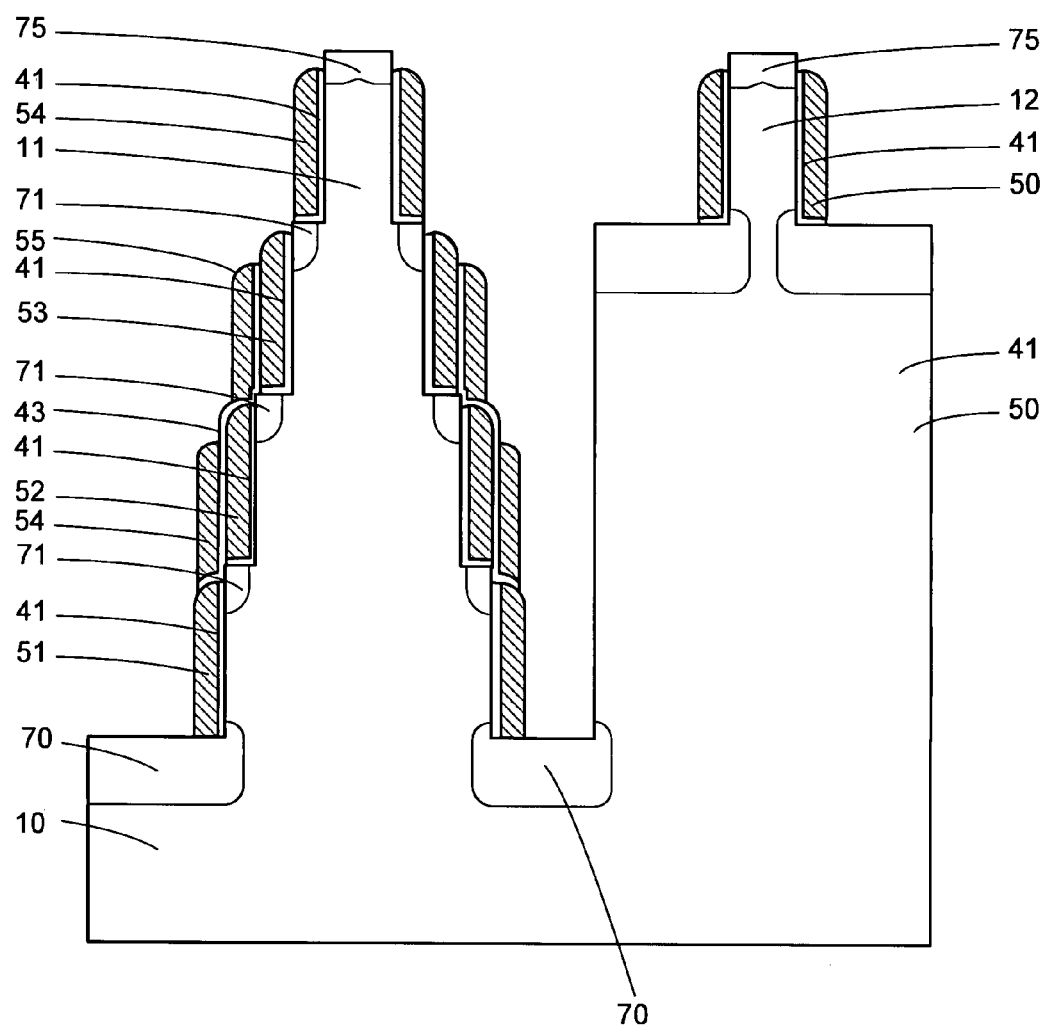
FIG. 36 is a cross section showing the further another example of the manufacturing process of the semiconductor device of the invention (fourth embodiment).

FIG. 36 shows an example in which the first island-shaped semiconductor layer 11 is formed with a height different from that in FIG. 1.

In the first island-shaped semiconductor layer 11 in FIG. 1, a transistor is formed on each of the steps in the side wall. More specifically, the transistors have a gate insulation film 41 made by a silicon oxide film and gate electrodes 51 to 54 made by a polysilicon film, and are electrically connected in series by the impurity diffusion layer 71.

In the second island-shaped semiconductor layer 12 in FIG. 1, one transistor having the gate insulation film 41 made by a silicon oxide film and a gate electrode 50 made by a polysilicon film is formed on the side wall having no steps.

An impurity diffusion layer 70 is formed under the transistors formed on the side walls of the first and second island-shaped semiconductor layers 11 and 12. The impurity diffusion layer has a conductive type opposite to that of the substrate 10. The first and second island-shaped semiconductor layers 11 and 12 and the transistors on their side walls are electrically insulated from the substrate 10 by a depletion layer which is formed by applying voltage across the substrate 10 or the island-shaped semiconductor layers 11 and 12 and the impurity diffusion layer 70.

Further, in the first island-shaped semiconductor layer in FIG. 2, a flash memory cell unit is formed in which flash memory cells using polysilicon films 52 and 53 as charge storage layers and using polysilicon films 54 and 55 as control gate electrodes are sandwiched by selective transistors in the vertical direction. In the second island-shaped semiconductor layer 12, a transistor is formed in an upper part of the side wall and a capacitor is formed in a lower part of the side wall. The transistor in the upper part has the gate oxide film 41 made by a silicon oxide film and the gate electrode 50 made by a polysilicon film. In the capacitor in the lower part, the silicon oxide film 41 is made by a dielectric film, and the impurity diffusion layer 70 and the electrode 50 made by a polysilicon film which face each other while sandwiching the silicon oxide film 41 are set as the other electrode. The transistor and the capacitor are electrically connected to each other through the impurity diffusion layer 70.

The impurity diffusion layer 70 is formed under the transistor and capacitor formed on the side walls of the first and second island-shaped semiconductor layers 11 and 12. The impurity diffusion layer has a conductive type opposite to that of the substrate 10. The first and second island-shaped semiconductor layers 11 and 12 and the transistors on their side walls are electrically insulated from the substrate 10 by a depletion layer which is formed by applying voltage across the substrate 10 or the island-shaped semiconductor layers 11 and 12 and the impurity diffusion layer 70.

Second Embodiment

Example of Processes of Manufacturing Semiconductor Device

As described in detail in the first embodiment, in the semiconductor device of the invention, at least two island-shaped semiconductor layers are provided on the substrate surface. Each kind of the island-shaped semiconductor layers is provided with an element in a stair part of the side wall divided by the step or on the side wall having no steps. The island-shaped semiconductor layers are different from one another with respect to the number of steps in the side walls or the presence/absence of a step depending on the kind. Elements formed on the side walls of the island-shaped semiconductor layers may be transistors, memory cells, capacitors, and the like. In the step portion(s) in the side walls of the island-shaped semiconductor layers, impurity diffusion layers are formed in a self aligned manner and no elements are formed. For example, four transistors formed in an island-shaped semiconductor layer having three steps are connected in series via impurity diffusion layers formed in the three steps.

Some examples of processes of manufacturing the above-described semiconductor device will be described hereinbelow. The invention is not limited to combinations of manufacturing processes in the following manufacturing examples. A person skilled in the art can employ various combinations of the manufacturing processes and, obviously, the invention includes such embodiments.

FIGS. 3 to 27 are cross sections showing an example of the manufacturing process of the semiconductor device of the invention. Specifically, the drawings show an example of the manufacturing process for simultaneously forming the island-shaped semiconductor layer 11 whose side wall has steps and the island-shaped semiconductor layer 12 whose side wall does not have steps in a single same semiconductor device.

Figure 3:
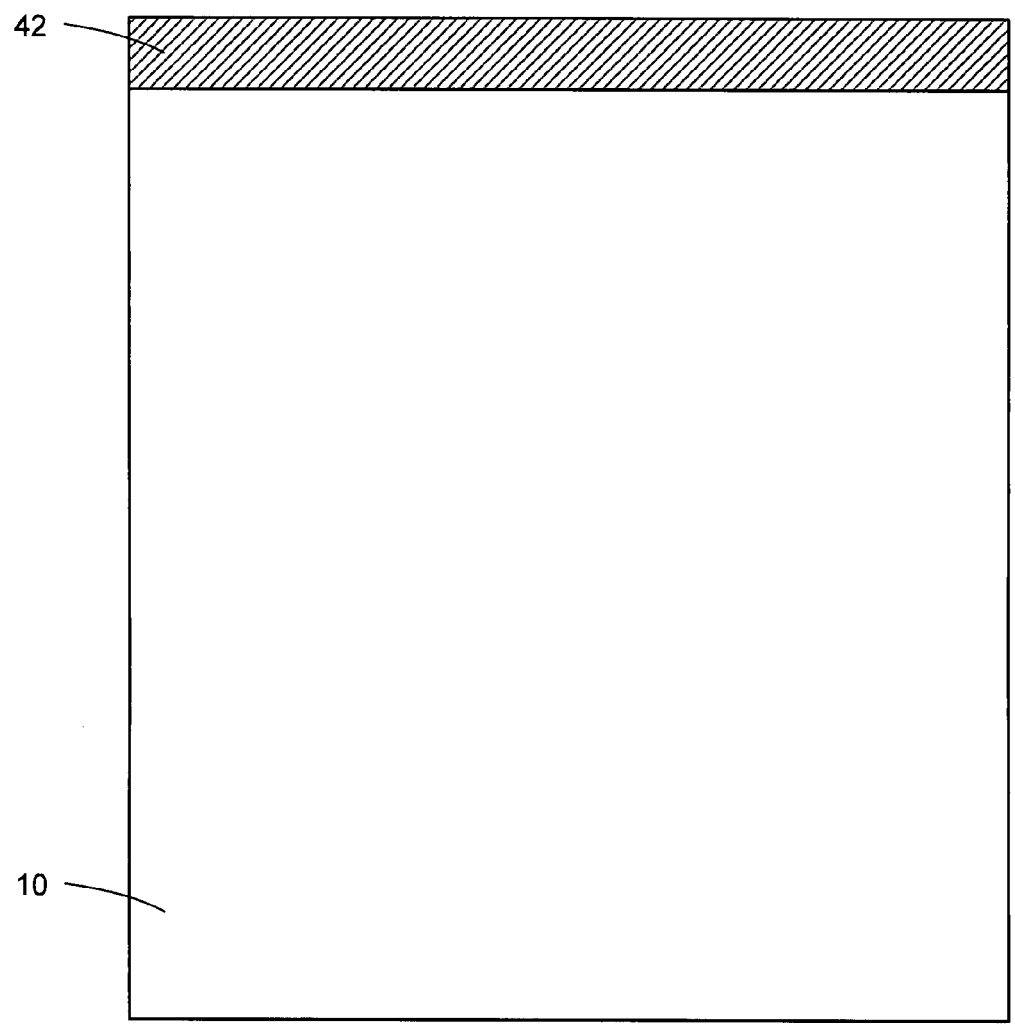
FIG. 3 is a cross section showing an example of a manufacturing process of the semiconductor device of the invention (second embodiment).
Figure 4:
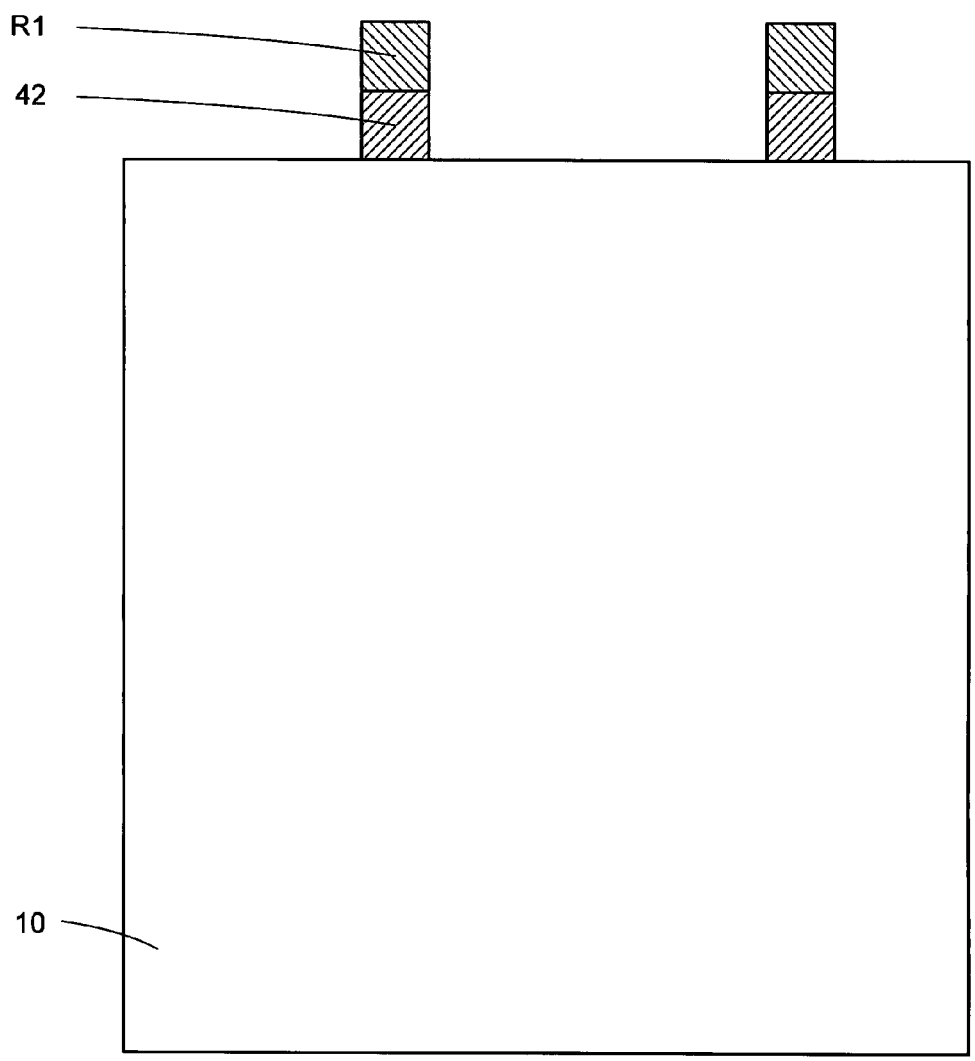
FIG. 4 is a cross section showing the example of the manufacturing process of the semiconductor device of the invention (second embodiment).

First, as shown in FIG. 3, for example, on the surface of the p-type silicon substrate 10, a silicon oxide film 42 as a first insulation film serving as a mask layer is deposited to about 200 to 2,000 nm. Next, as shown in FIG. 4, a resist R1 patterned by known photolithography is used as a mask, and the silicon oxide film 42 is etched by reactive ion etching. After that, the resist R1 is removed.

The material used for the first insulation film 42 is not limited to silicon oxide but may be a material such that the film is not etched when the surface is etched by applying reactive ion etching to the substrate 10 in a post process or whose etching speed is lower than that of the substrate 10. For example, the first insulation film 42 may be a conductive film made by a silicon nitride film, or a stack film made of two or more kinds of materials such as a silicon oxide film and a silicon nitride film.

Figure 5:
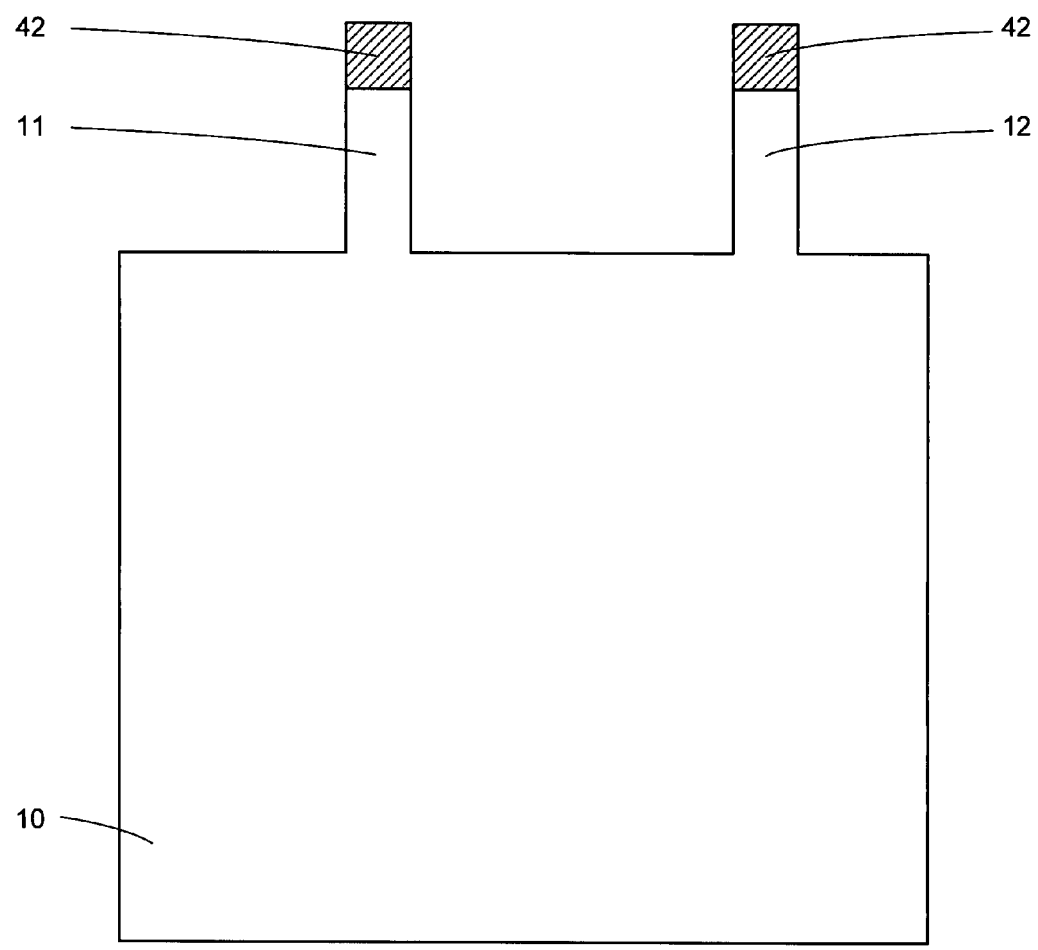
FIG. 5 is a cross section showing the example of the manufacturing process of the semiconductor device of the invention (second embodiment).

Subsequently, as shown in FIG. 5, the surface of the substrate 10 is etched to a depth of 50 to 5000 nm by reactive ion etching using the silicon oxide film 42 as a mask. The portions of the substrate 10, under the silicon oxide film 42 and remained without being etched, become the first and second island-shaped semiconductor layers 11 and 12.

Figure 6:
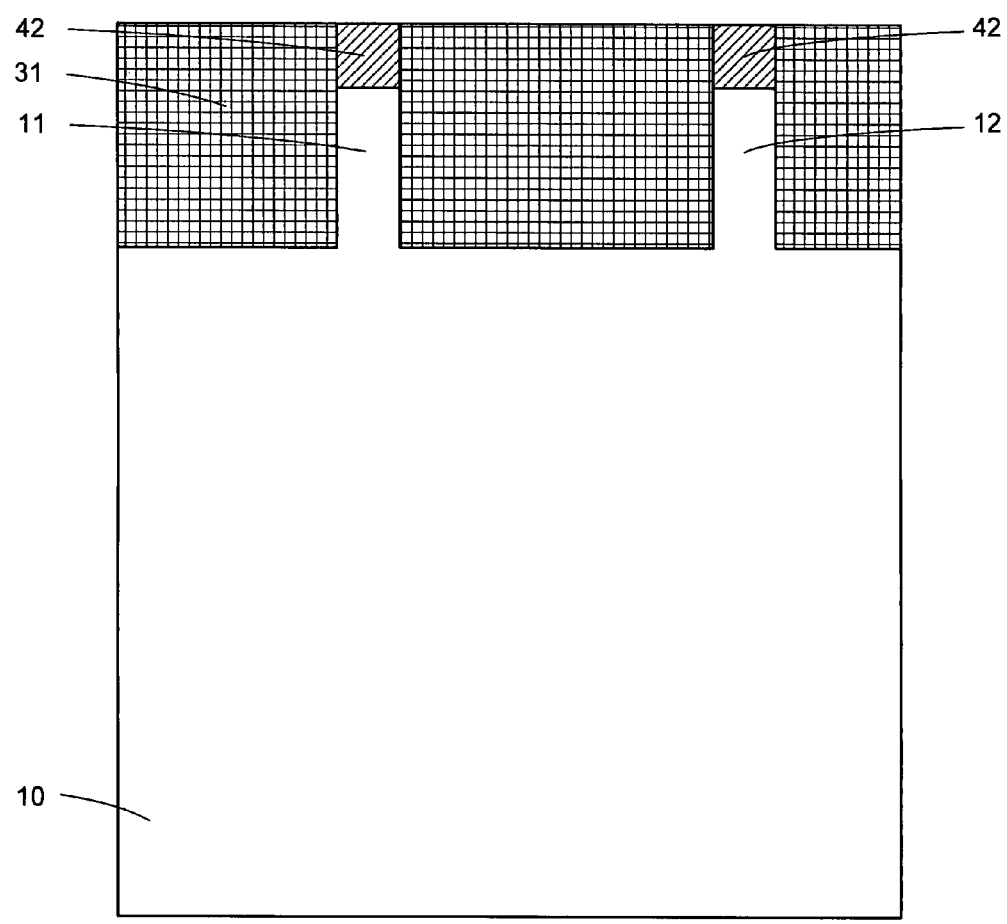
FIG. 6 is a cross section showing the example of the manufacturing process of the semiconductor device of the invention (second embodiment).
Figure 7:
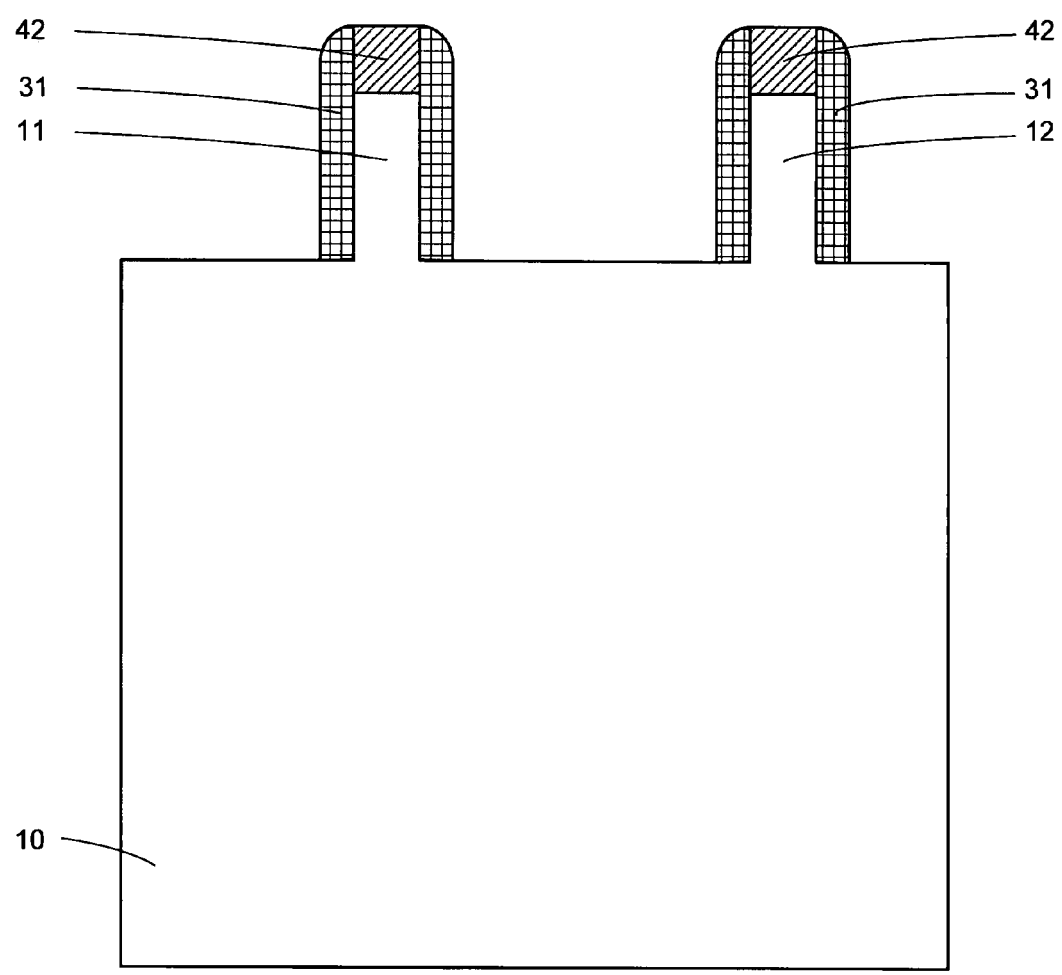
FIG. 7 is a cross section showing the example of the manufacturing process of the semiconductor device of the invention (second embodiment).
Figure 8:
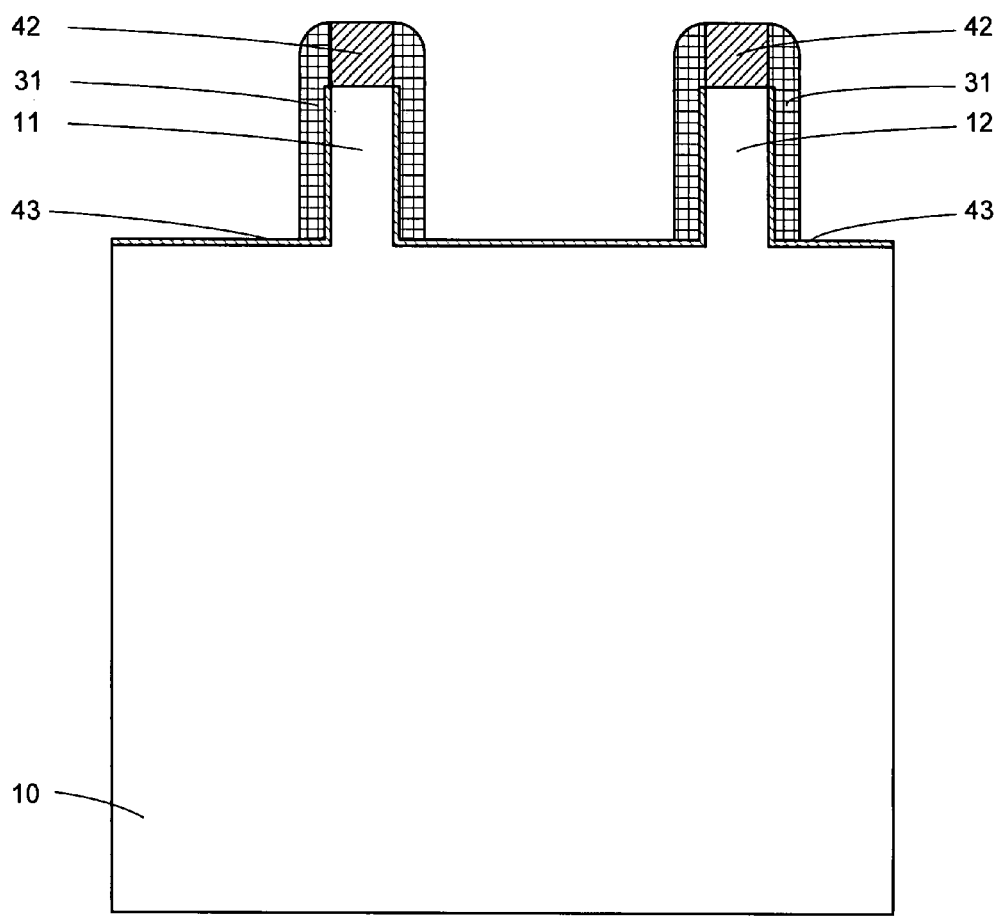
FIG. 8 is a cross section showing the example of the manufacturing process of the semiconductor device of the invention (second embodiment).

Next, as shown in FIG. 6, a silicon nitride film 31 as a third insulation film is deposited to 10 to 1000 nm on the surface of the substrate 10. After that, as shown in FIG. 7, by anisotropic etching, the silicon nitride film 31 is processed for shaping sidewalls on side walls of the silicon oxide film 42 and on the side walls of the first and second island-shaped semiconductor layers 11 and 12. It is also possible to form a silicon oxide film 43 as a second insulation film on the exposed surface of the substrate 10 and, after that, form the silicon nitride film 31 as the third insulation film on the silicon oxide film (FIG. 8).

Figure 9:
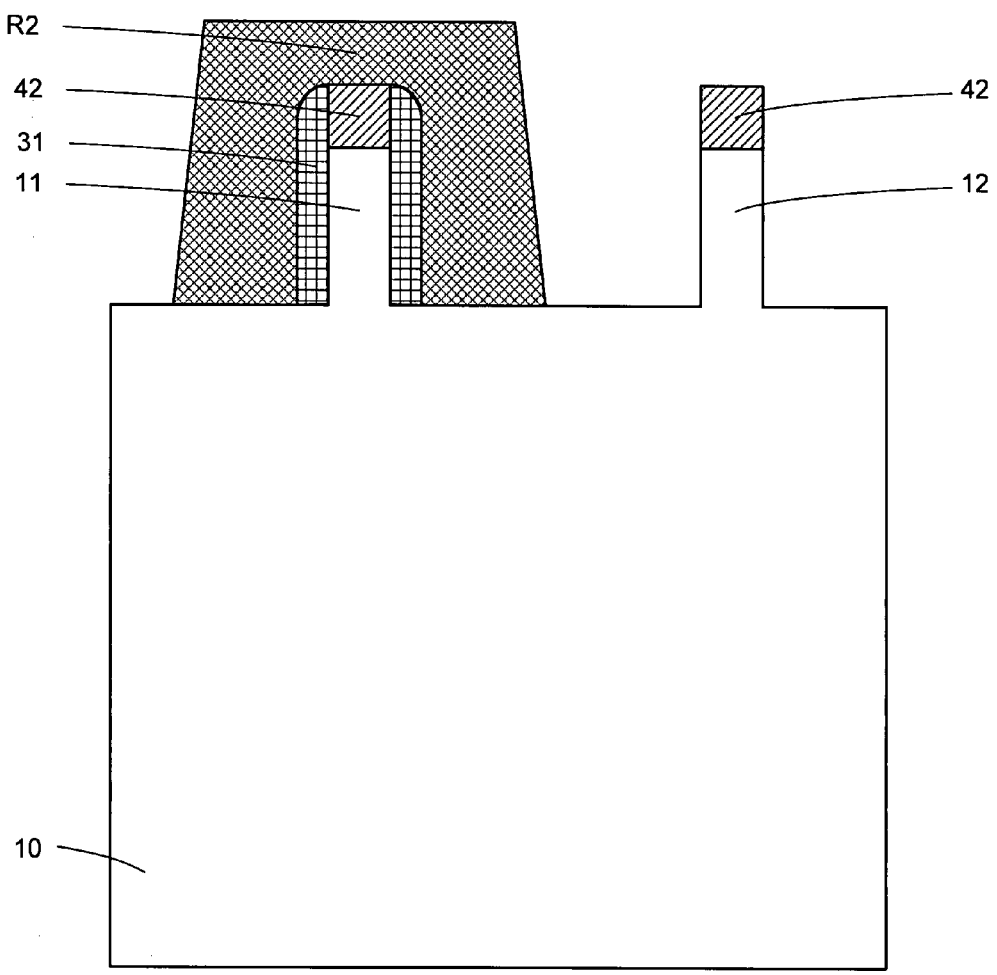
FIG. 9 is a cross section showing the example of the manufacturing process of the semiconductor device of the invention (second embodiment).
Figure 10:
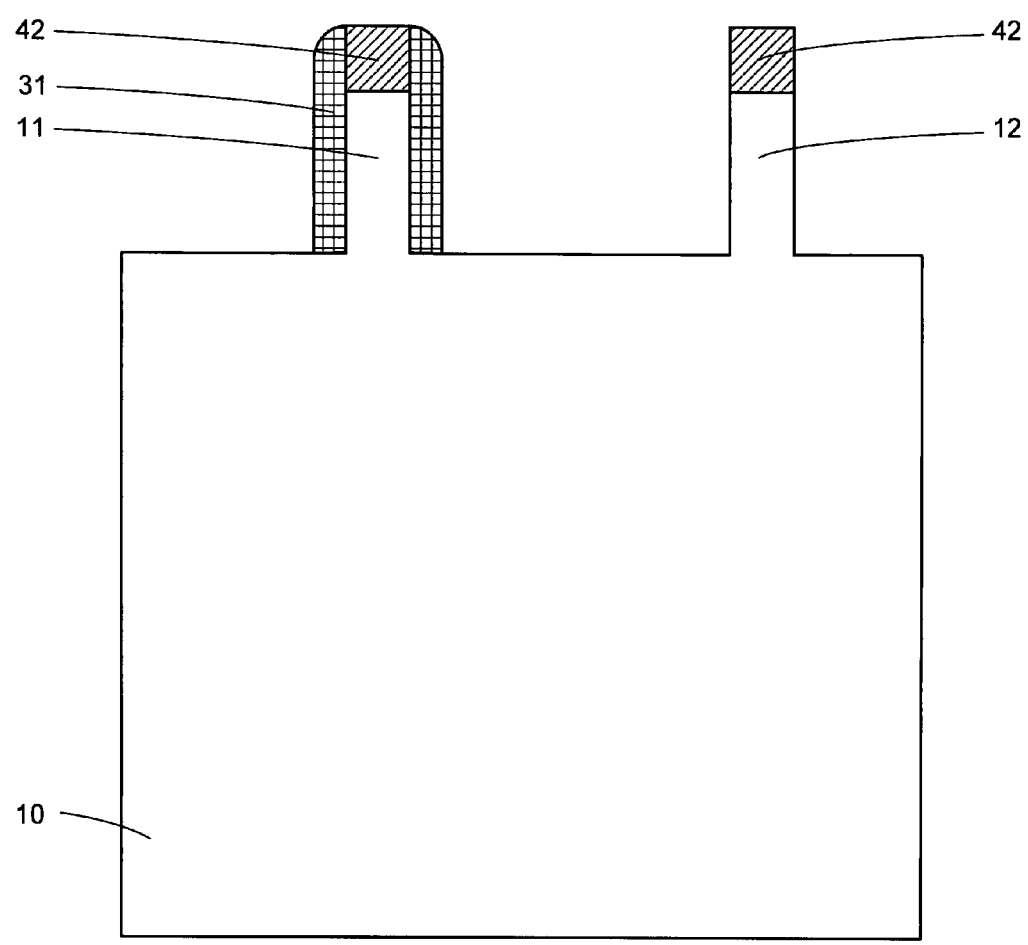
FIG. 10 is a cross section showing the example of the manufacturing process of the semiconductor device of the invention (second embodiment).

Subsequently, as shown in FIG. 9, the first island-shaped semiconductor layer 11 is covered with a resist R2 and, on the other hand, the second island-shaped semiconductor layer 12 is left exposed without being covered with the resist R2. By applying isotropic etching of the known photolithography, the silicon nitride film 31 formed on the side wall of the second island-shaped semiconductor layer 12 is removed. After that, the resist R2 is removed (FIG. 10).

Figure 11:
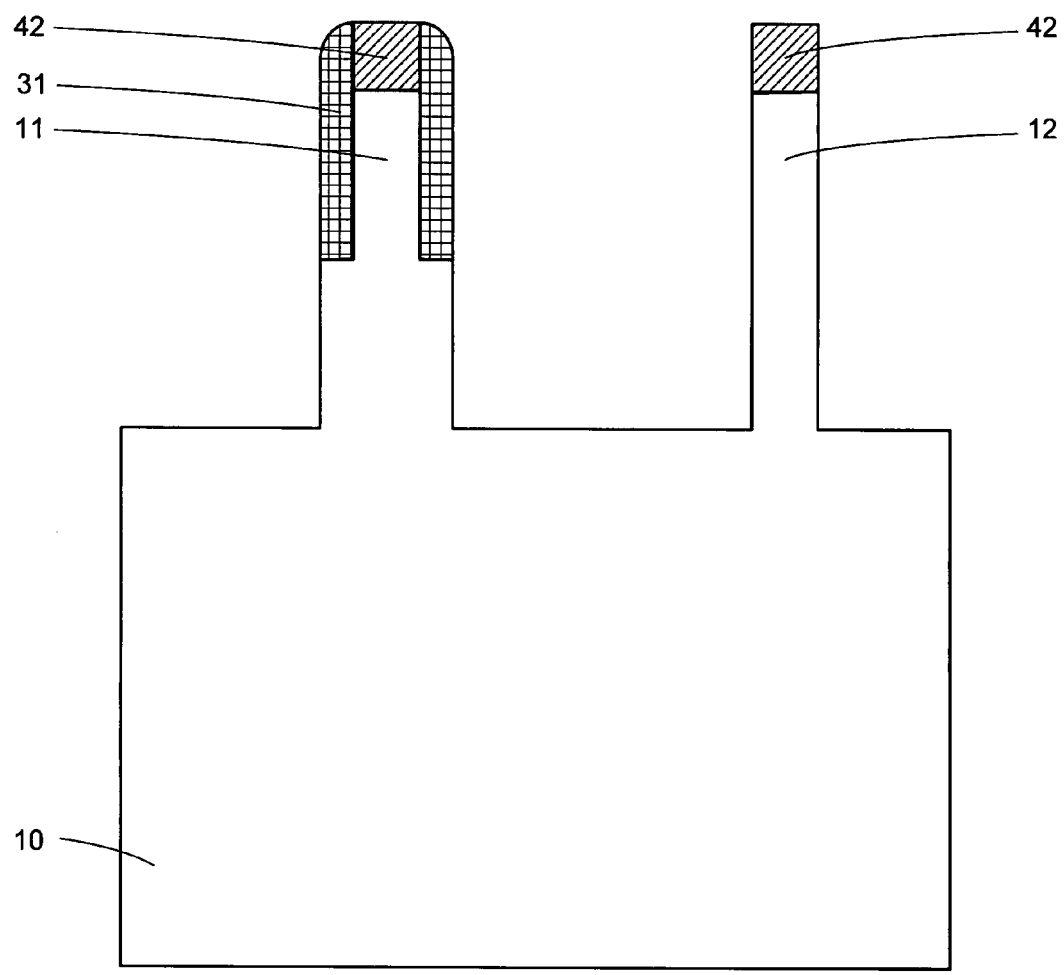
FIG. 11 is a cross section showing the example of the manufacturing process of the semiconductor device of the invention (second embodiment).

Subsequently, by reactive ion etching using the sidewall-shaped silicon nitride film 31 as a mask, the silicon substrate 10 is further etched to 50 to 5000 nm. In the case where the silicon oxide film 43 is formed on the substrate surface and on the side walls of the island-shaped semiconductor layers as shown in FIG. 8, it is sufficient to perform the etching using, as a mask, the sidewall-shaped silicon nitride film 31 which is formed on the silicon oxide film 43 on the side walls of the island-shaped semiconductor layers 11 and 12. By etching the substrate 10 using anisotropic etching, as shown in FIG. 11, the first island-shaped semiconductor layer 11 whose side wall has a single step and the second island-shaped semiconductor layer 12 whose side wall does not have a step are formed.

Figure 12:
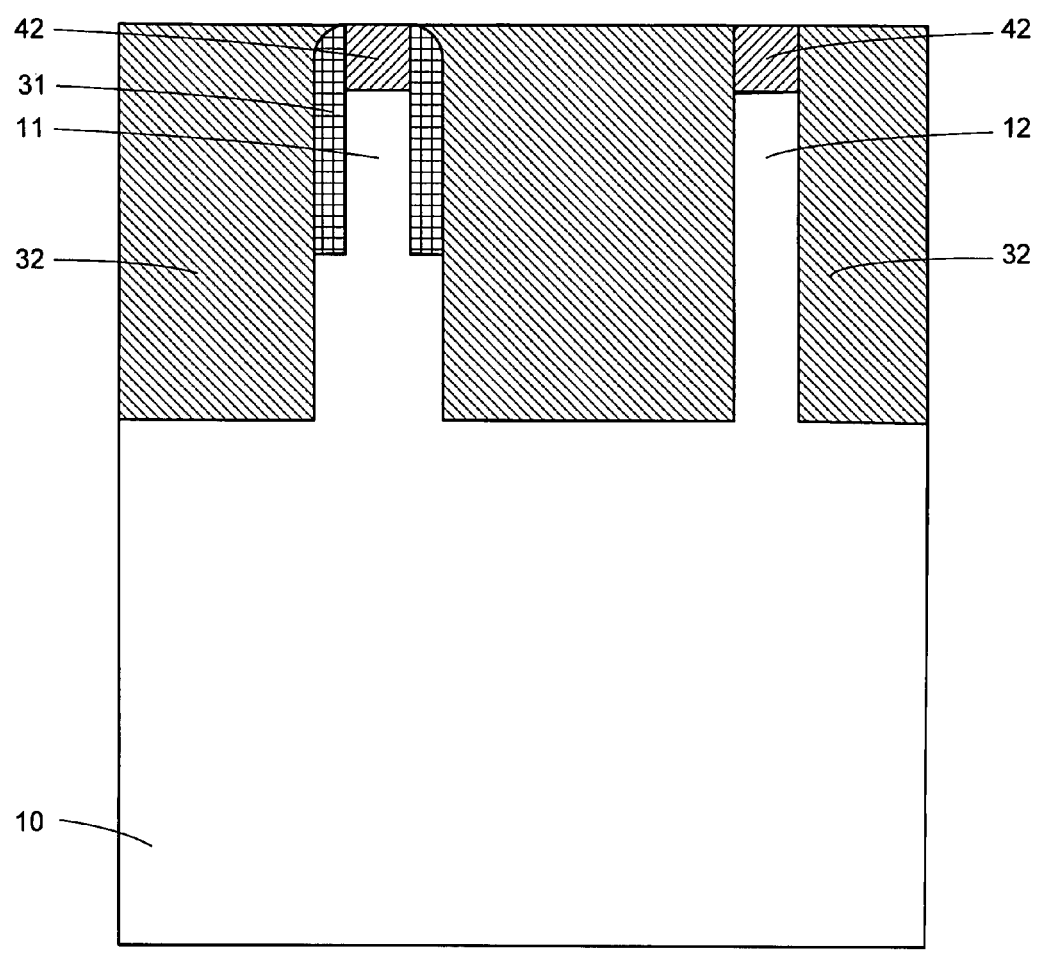
FIG. 12 is a cross section showing the example of the manufacturing process of the semiconductor device of the invention (second embodiment).
Figure 13:
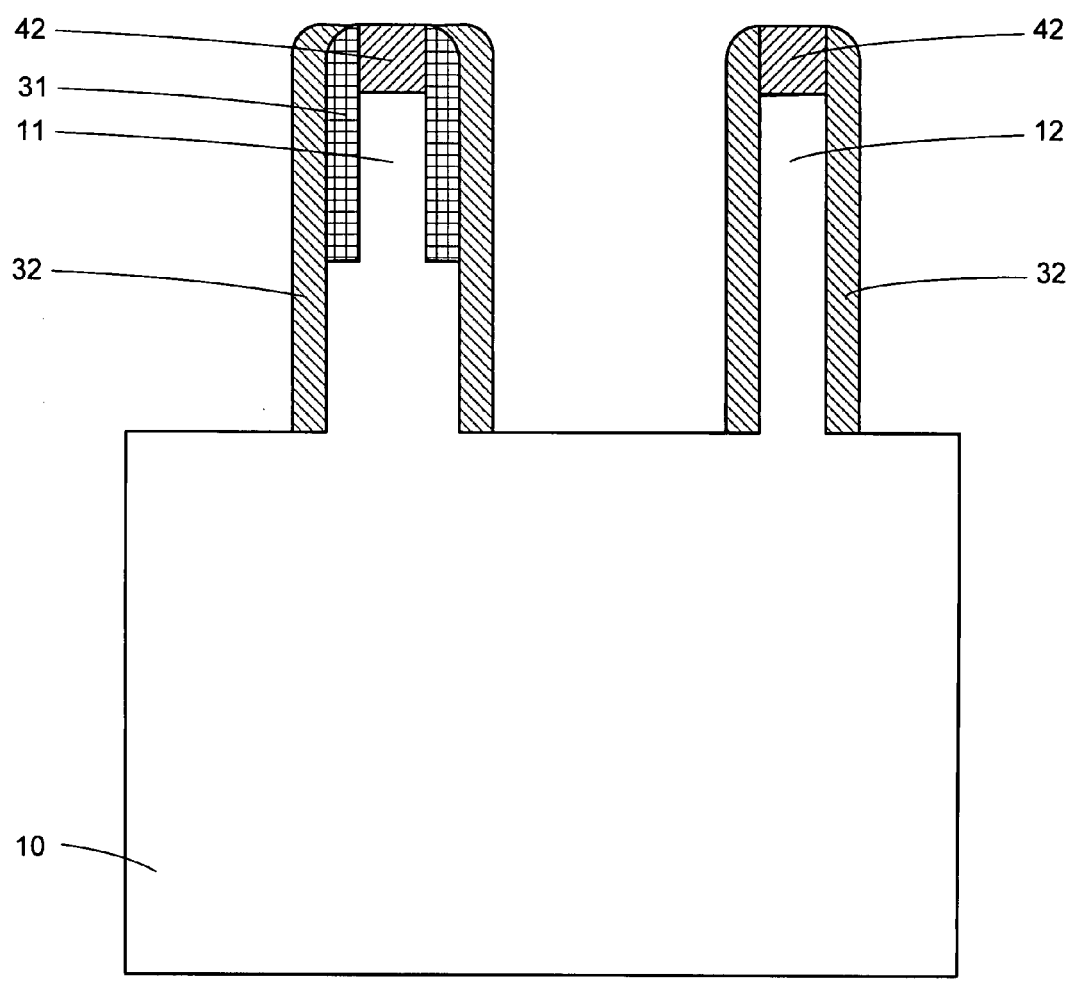
FIG. 13 is a cross section showing the example of the manufacturing process of the semiconductor device of the invention (second embodiment).

Subsequently, as shown in FIG. 12, the silicon nitride film 32 as a fourth insulation film is deposited to 10 to 1000 nm on the surface of the substrate 10. After that, as shown in FIG. 13, by anisotropic etching, a silicon nitride film 32 is further processed for shaping sidewalls on the side walls made of the silicon oxide film 42, the first and second island-shaped semiconductor layers 11 and 12, and the sidewall-shaped silicon nitride film 31.

Figure 14:
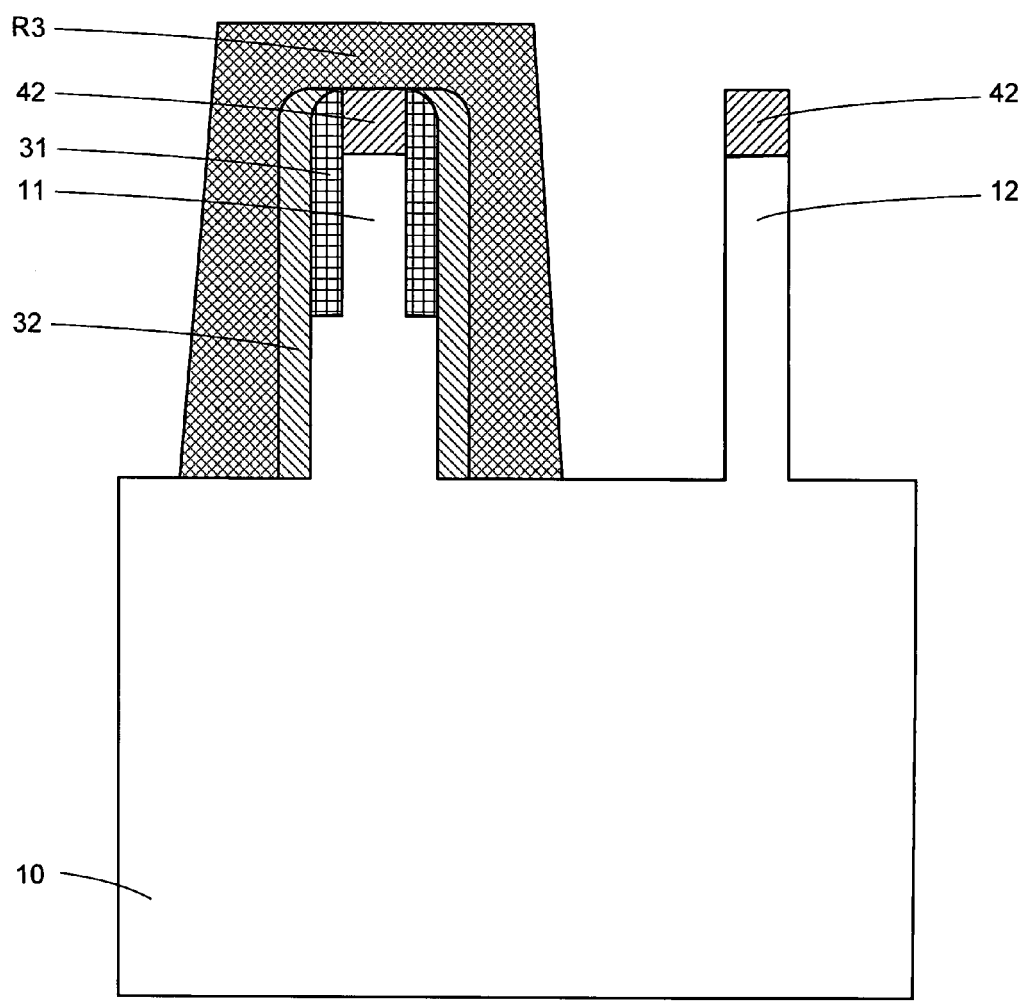
FIG. 14 is a cross section showing the example of the manufacturing process of the semiconductor device of the invention (second embodiment).
Figure 15:
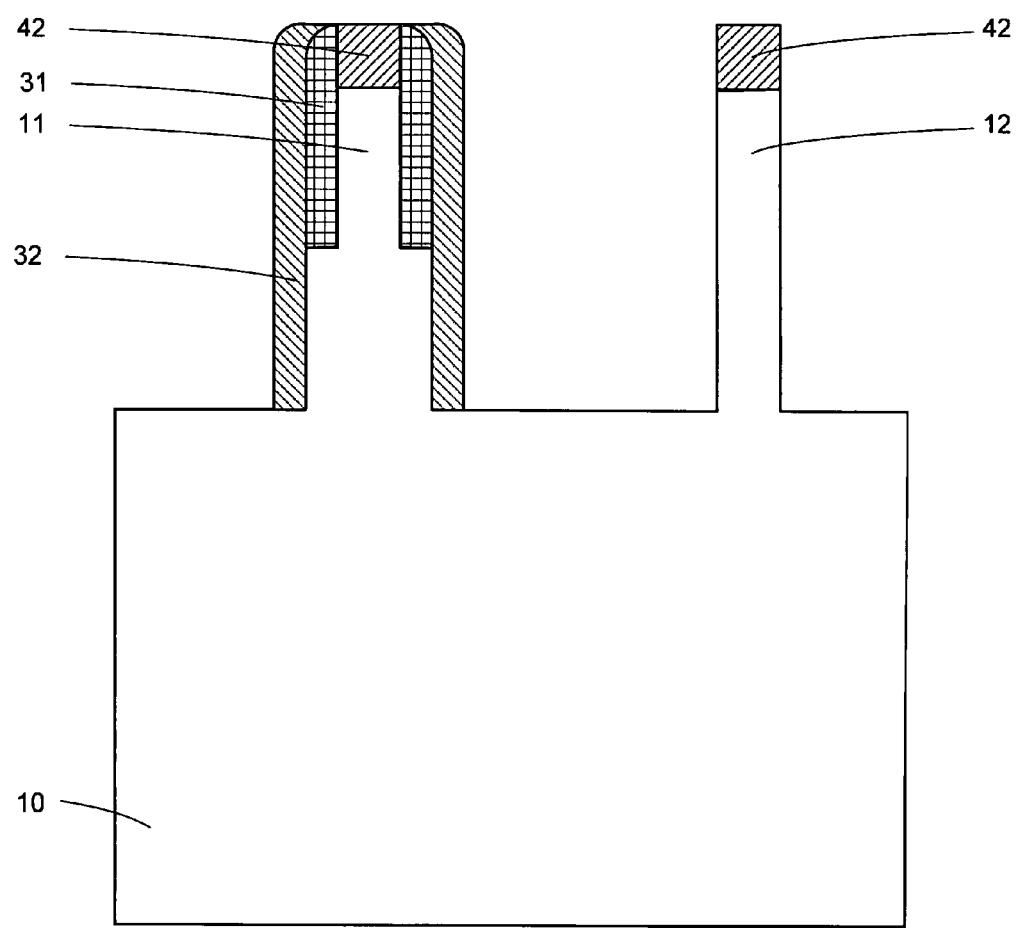
FIG. 15 is a cross section showing the example of the manufacturing process of the semiconductor device of the invention (second embodiment).
Figure 16:
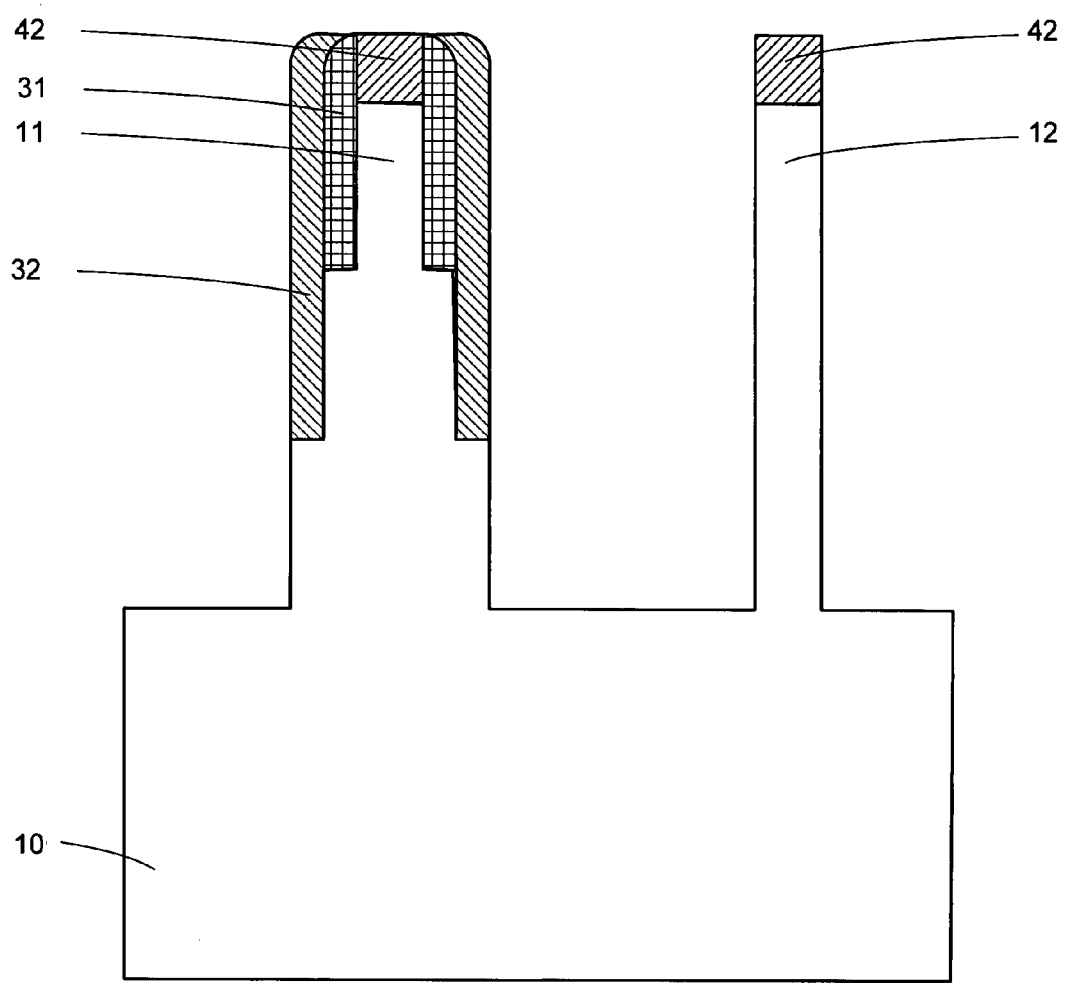
FIG. 16 is a cross section showing the example of the manufacturing process of the semiconductor device of the invention (second embodiment).
Figure 17:
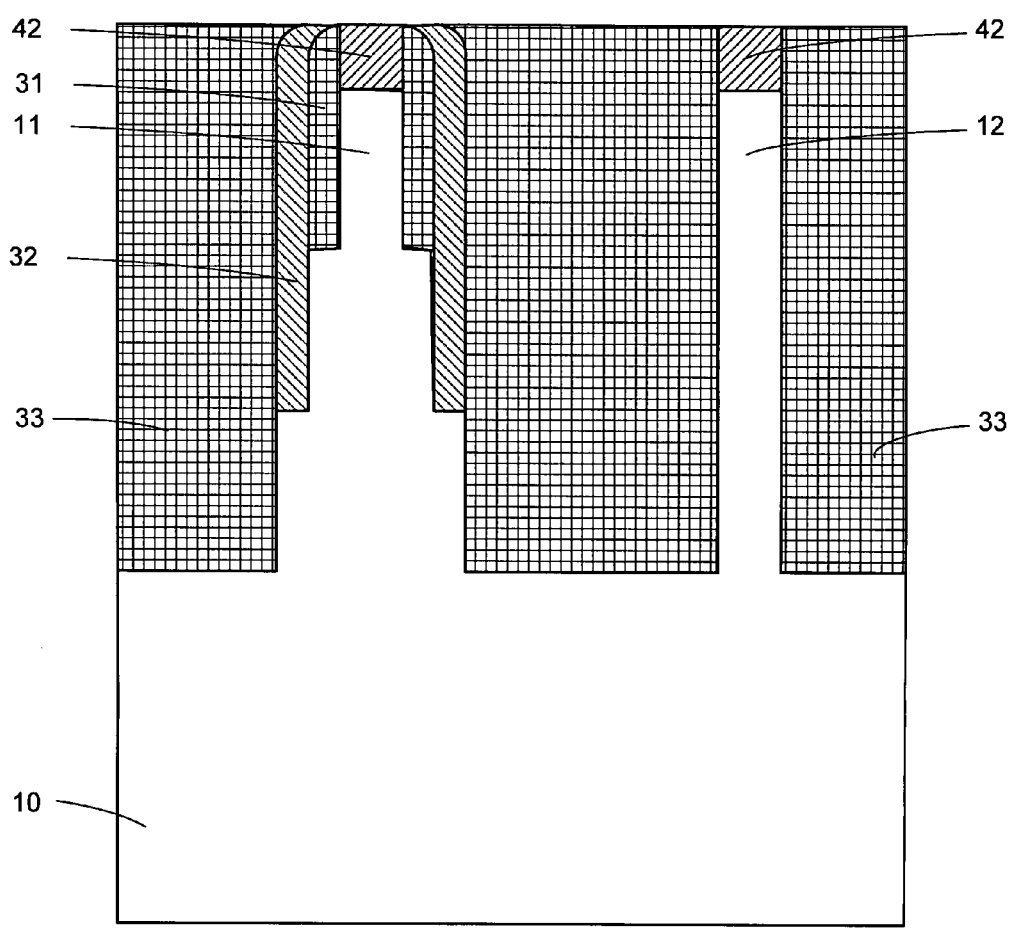
FIG. 17 is a cross section showing the example of the manufacturing process of the semiconductor device of the invention (second embodiment).
Figure 18:
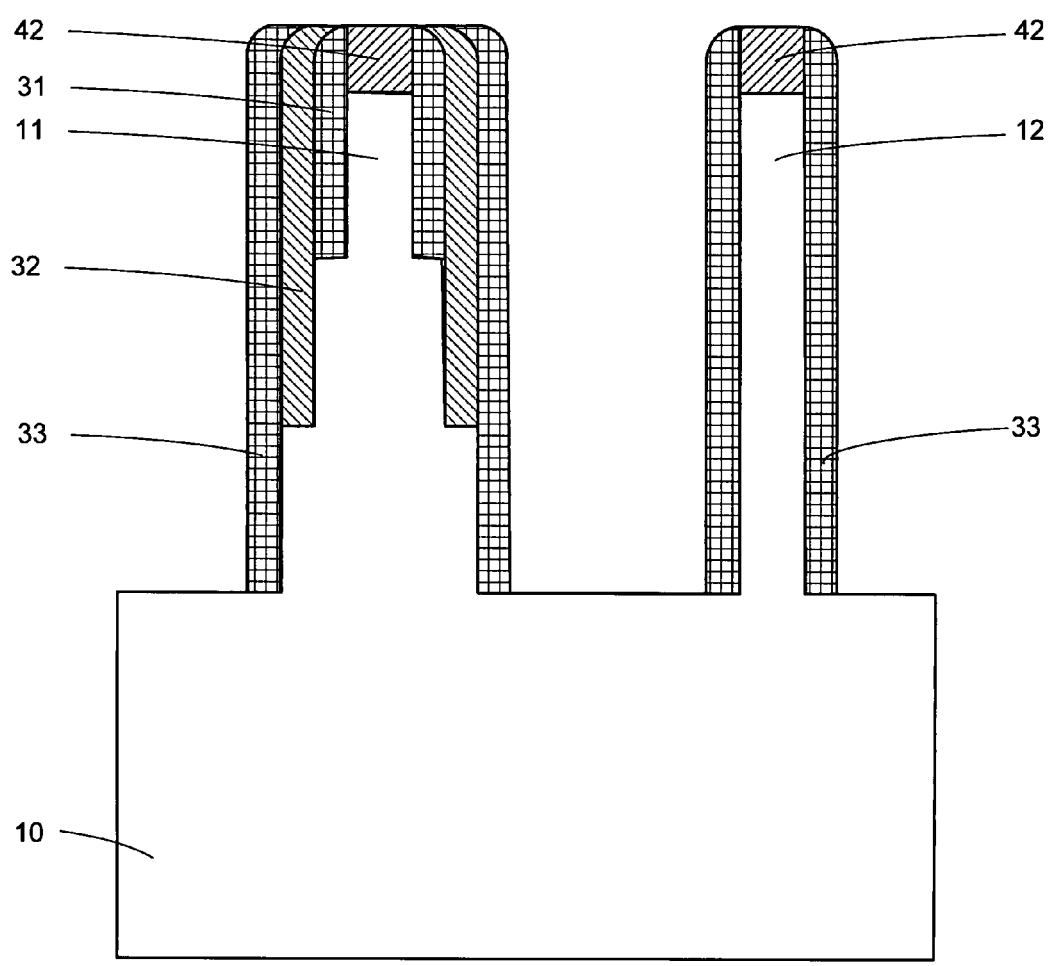
FIG. 18 is a cross section showing the example of the manufacturing process of the semiconductor device of the invention (second embodiment).
Figure 19:
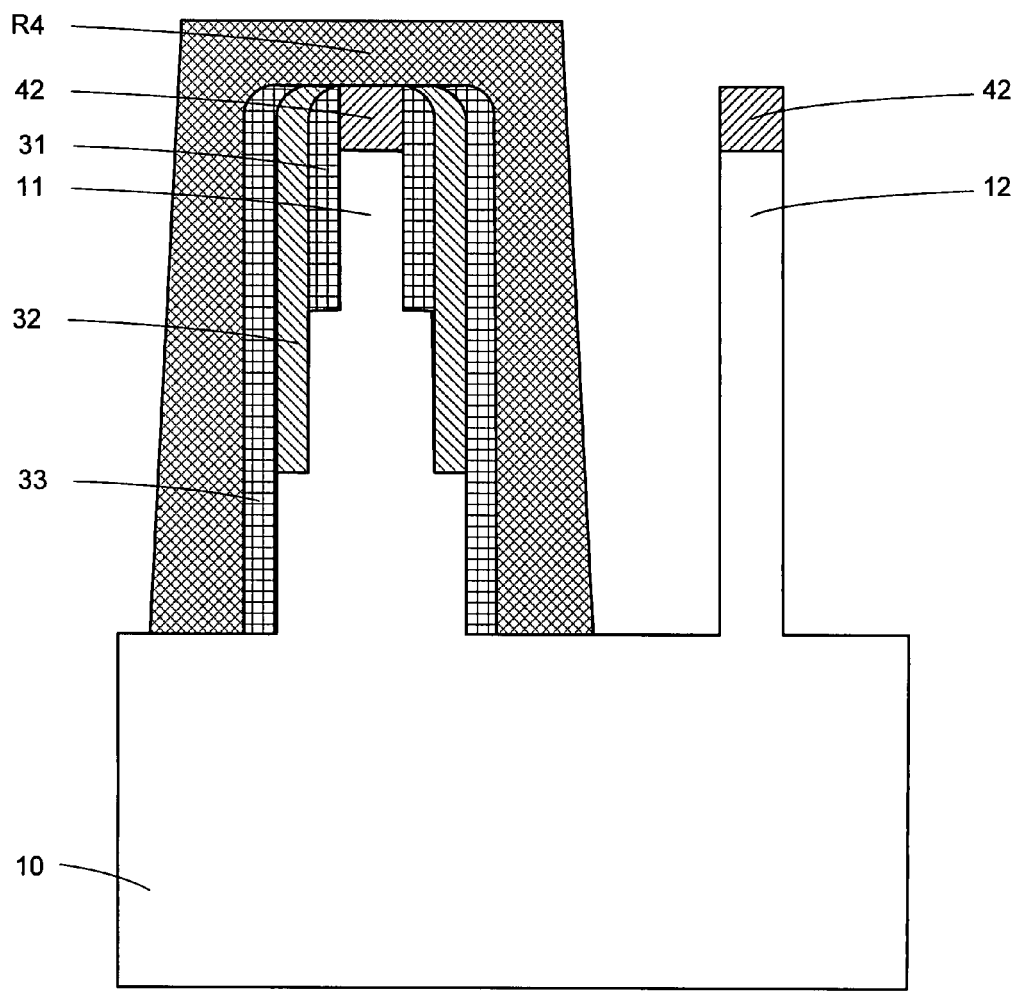
FIG. 19 is a cross section showing the example of the manufacturing process of the semiconductor device of the invention (second embodiment).
Figure 20:
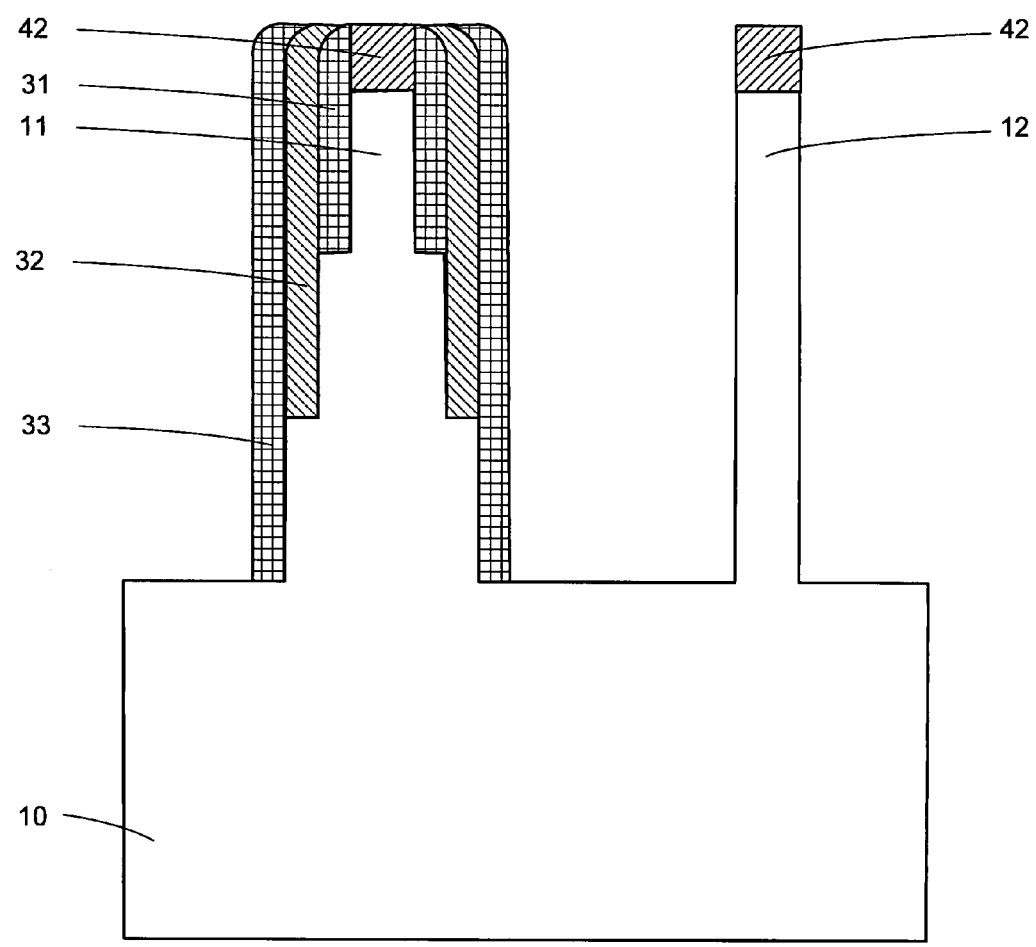
FIG. 20 is a cross section showing the example of the manufacturing process of the semiconductor device of the invention (second embodiment).

Subsequently, by repeatedly applying processes similar to those shown in FIGS. 9 to 11, the substrate 10 is further etched and, as a result, the island-shaped semiconductor layer 11 whose side wall has two steps and the island-shaped semiconductor layer 12 whose side wall has no steps are obtained (FIGS. 14 to 16).

Figure 21:
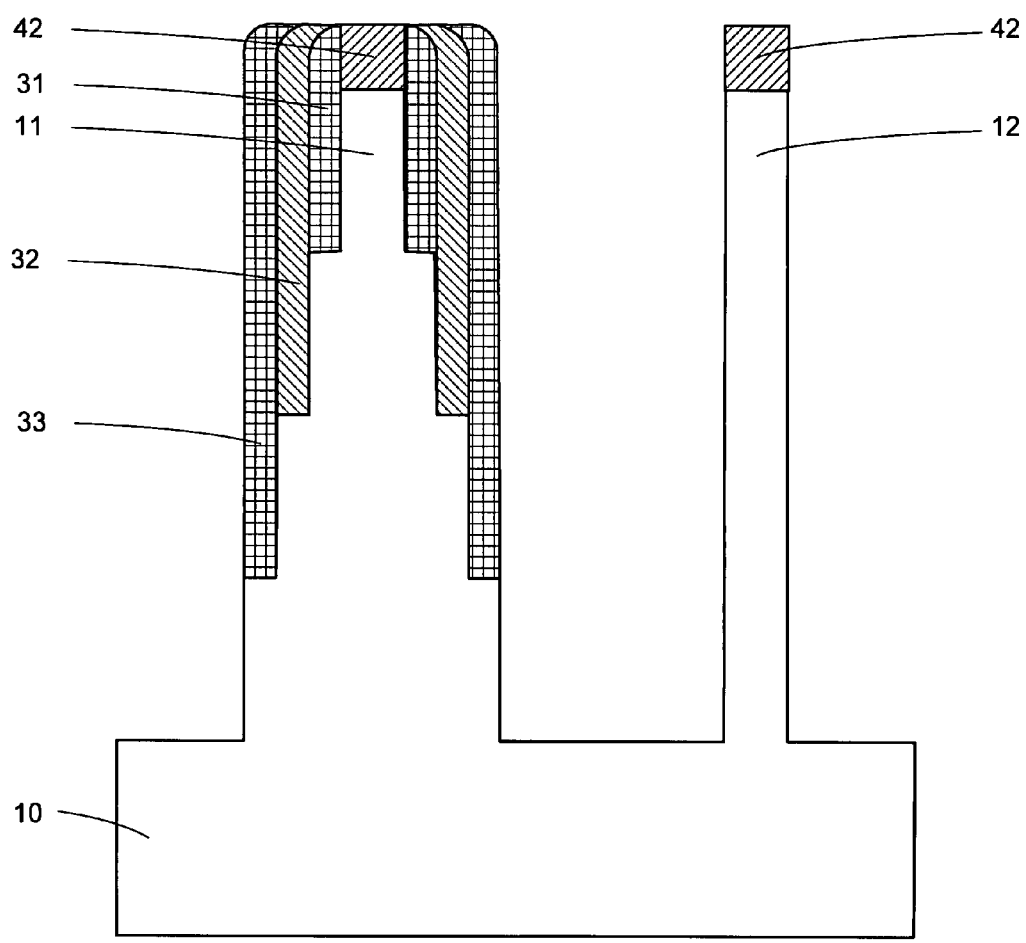
FIG. 21 is a cross section showing the example of the manufacturing process of the semiconductor device of the invention (second embodiment).

Further, by repeating processes similar to those in FIGS. 12 to 16 (FIGS. 17 to 21), the island-shaped semiconductor layer 11 whose side wall has three steps and the island-shaped semiconductor layer 12 whose side wall has no steps are obtained as shown in FIG. 21.

Although the manufacturing process for manufacturing the island-shaped semiconductor layer 11 having three steps has been described as an example in the embodiment, the number of steps is not limited to three but may be one, two, or four or more.

Figure 22:
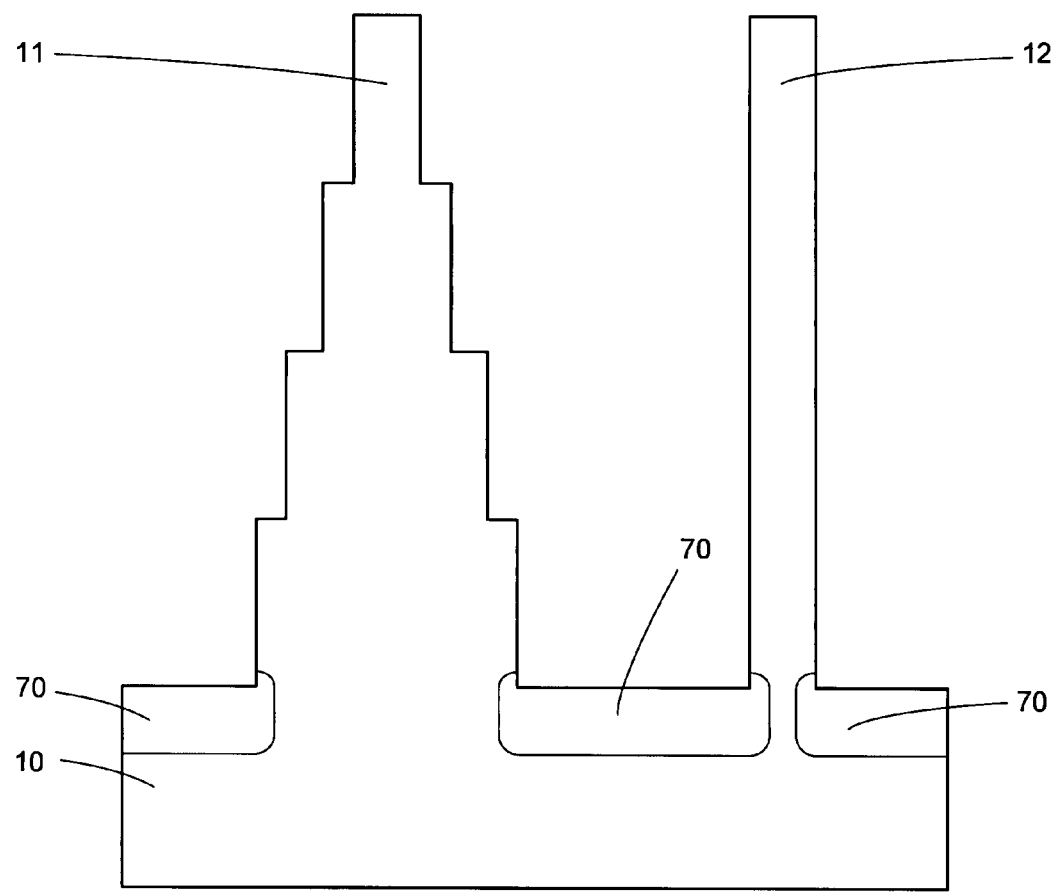
FIG. 22 is a cross section showing the example of the manufacturing process of the semiconductor device of the invention (second embodiment).

After that, the silicon nitride films 31, 32, and 33 formed on the side wall of the island-shaped semiconductor layer 11 are removed by isotropic etching, and the n-type impurity diffusion layer 70 is formed at the bottom of a groove formed between the island-shaped semiconductor layers (FIG. 22). The impurity diffusion layer 70 can be formed by implanting arsenic or phosphorus with a dose of about $1 \times 10^{13}$ to $1 \times 10^{17}/cm^2$ by, for example, ion implantation. In this case, it is sufficient to implant ions from a direction tilted with respect to the axis perpendicular to the substrate surface by about 0° to 45°. The ion implantation energy may be about 5 to 100 keV.

Next, as necessary, channel ion implantation is performed on the side walls of the first and second island-shaped semiconductor layers 11 and 12 using oblique ion implantation (not shown). In this case, it is sufficient to implant ions of, for example, boron from a direction tilted with respect to the axis perpendicular to the substrate surface by about 5° to 45° with a dose of about $1 \times 10^{11}$ to $1 \times 10^{13}/cm^2$. The ion implantation energy may be about 5 to 100 keV. The channel ion implantation is, preferably, performed in a plurality of directions around the first and second island-shaped semiconductor layers 11 and 12 for the reason that surface impurity concentration of the side walls of the first and second island-shaped semiconductor layers 11 and 12 can be made uniform. Alternatively, the channel ion implantation may be performed from all of directions. By applying CVD method in place of ion implantation, the oxide film containing boron is deposited in a groove between the island-shaped semiconductor layers, and boron diffusion from the deposited oxide film to the side walls of the first and second island-shaped semiconductor layers 11 and 12 may be used. When the impurity concentration distributions of the first and second island-shaped semiconductor layers 11 and 12 are equal to each other, impurities from surfaces of the first and second island-shaped semiconductor layers 11 and 12 may be introduced before formation of the first and second island-shaped semiconductor layers 11 and 12. The invention is not limited to the timings and means described in the embodiment.

Figure 23:
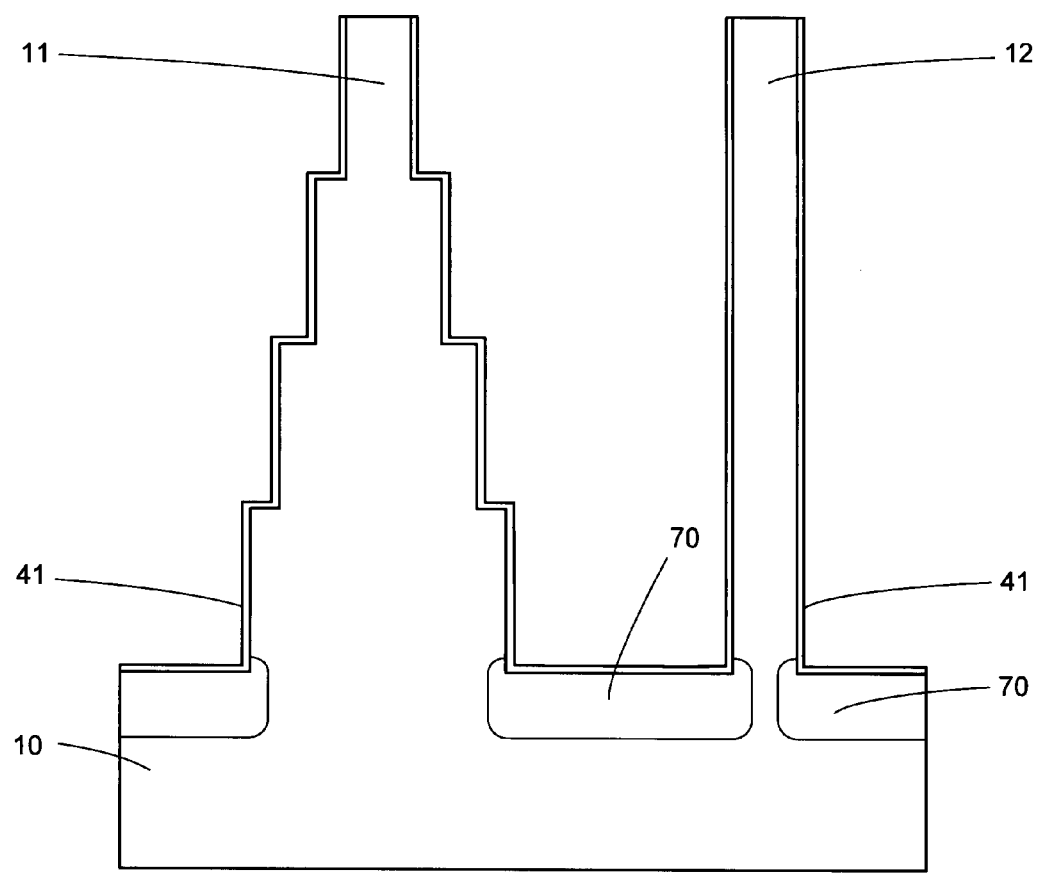
FIG. 23 is a cross section showing the example of the manufacturing process of the semiconductor device of the invention (second embodiment).

Subsequently, by thermal oxidation, the silicon oxide film 41 (gate oxide film) having a thickness of about 3 to 20 nm is formed as a fourth insulation film around the first and second island-shaped semiconductor layers 11 and 12 (FIG. 23).

Figure 24:
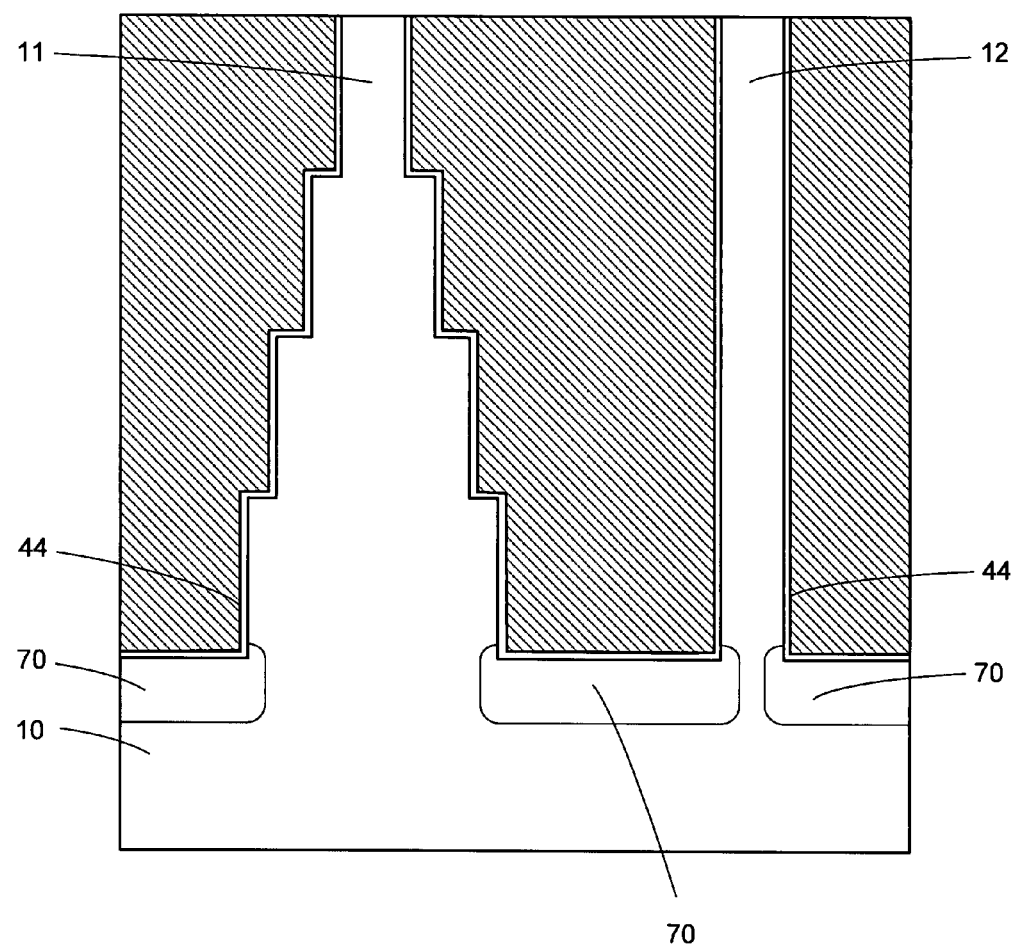
FIG. 24 is a cross section showing the example of the manufacturing process of the semiconductor device of the invention (second embodiment).
Figure 25:
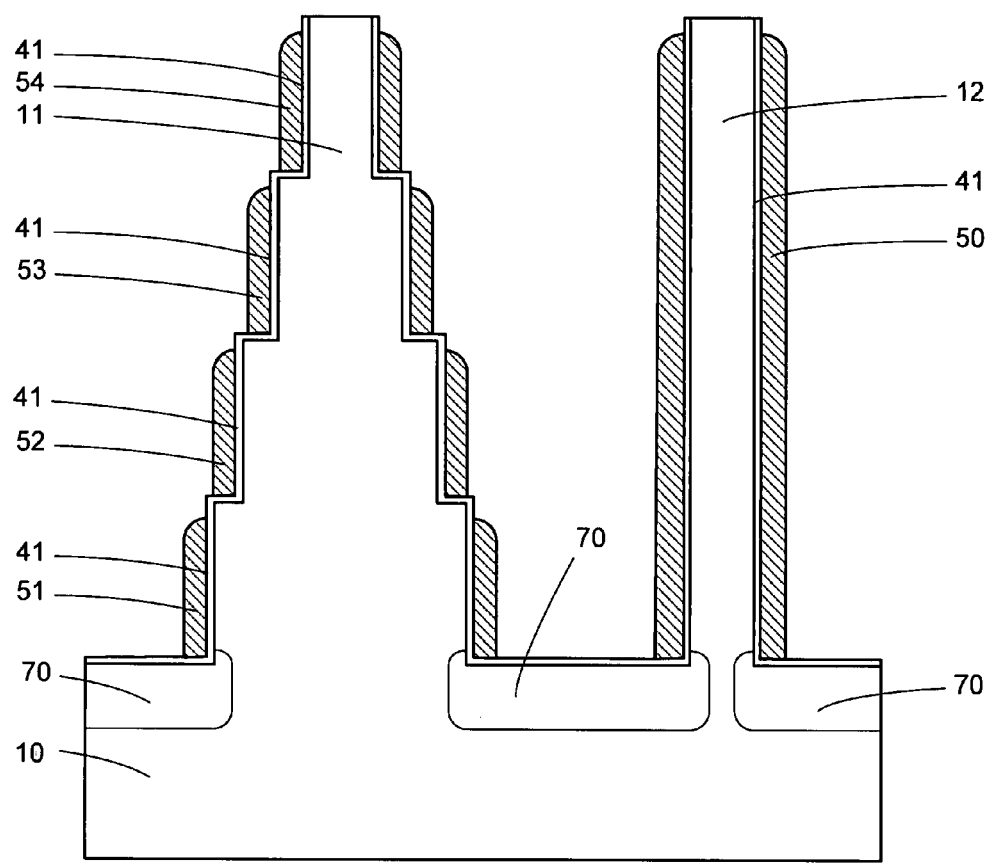
FIG. 25 is a cross section showing the example of the manufacturing process of the semiconductor device of the invention (second embodiment).

After that, the polysilicon film 50 as a first conductive film is deposited to about 20 to 200 nm. By anisotropic etching, the polysilicon film 50 is processed for shaping sidewalls to form polysilicon films 51, 52, 53, and 54 in one operation, which are isolated from one another, at stairs in the side wall of the island-shaped semiconductor layer 11 (FIG. 24). Thus, the sidewall-shaped polysilicon films 51, 52, 53, and 54 are formed in the shape of the island-shaped semiconductor layer 11 on the silicon oxide film 44 as a gate oxide film. On the island-shaped semiconductor layer 12 having no steps, only one polysilicon film 50 is formed on the silicon oxide film 44 as a gate oxide film (FIG. 25).

Figure 26:
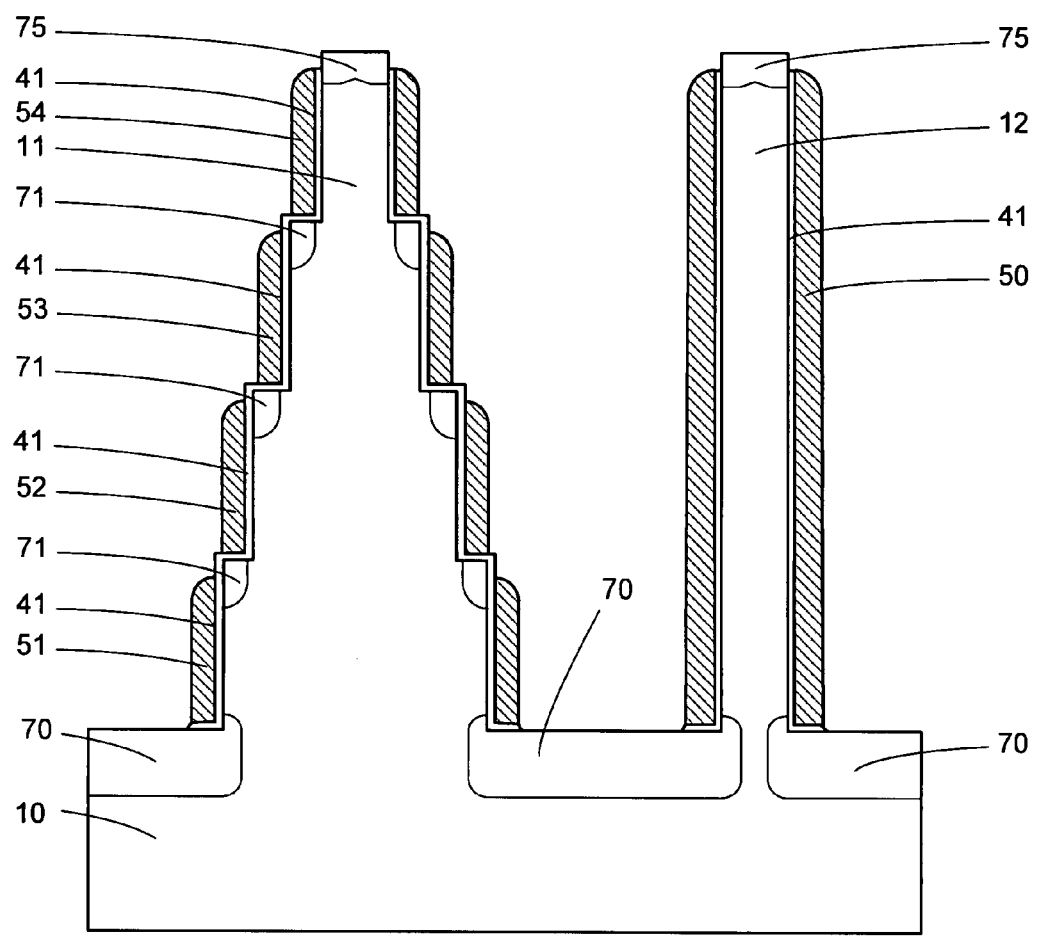
FIG. 26 is a cross section showing the example of the manufacturing process of the semiconductor device of the invention (second embodiment).

Subsequently, impurity is injected into the steps in the island-shaped semiconductor layer 11 on which the polysilicon film 50 is not formed, thereby forming the n-type impurity diffusion layer 71 (FIG. 26). For example, the impurity diffusion layer 71 can be formed by implanting arsenic or phosphorus at a dose of about $1 \times 10^{12}$ to $1 \times 10^{15}/cm^2$ with implantation energy of 5 to 100 keV from a direction tilted of 0° to 45° to the axis perpendicular to the substrate surface. Ions may be implanted in the island-shaped semiconductor layer 11 from a single direction, a plurality of directions, or all directions.

Figure 27:
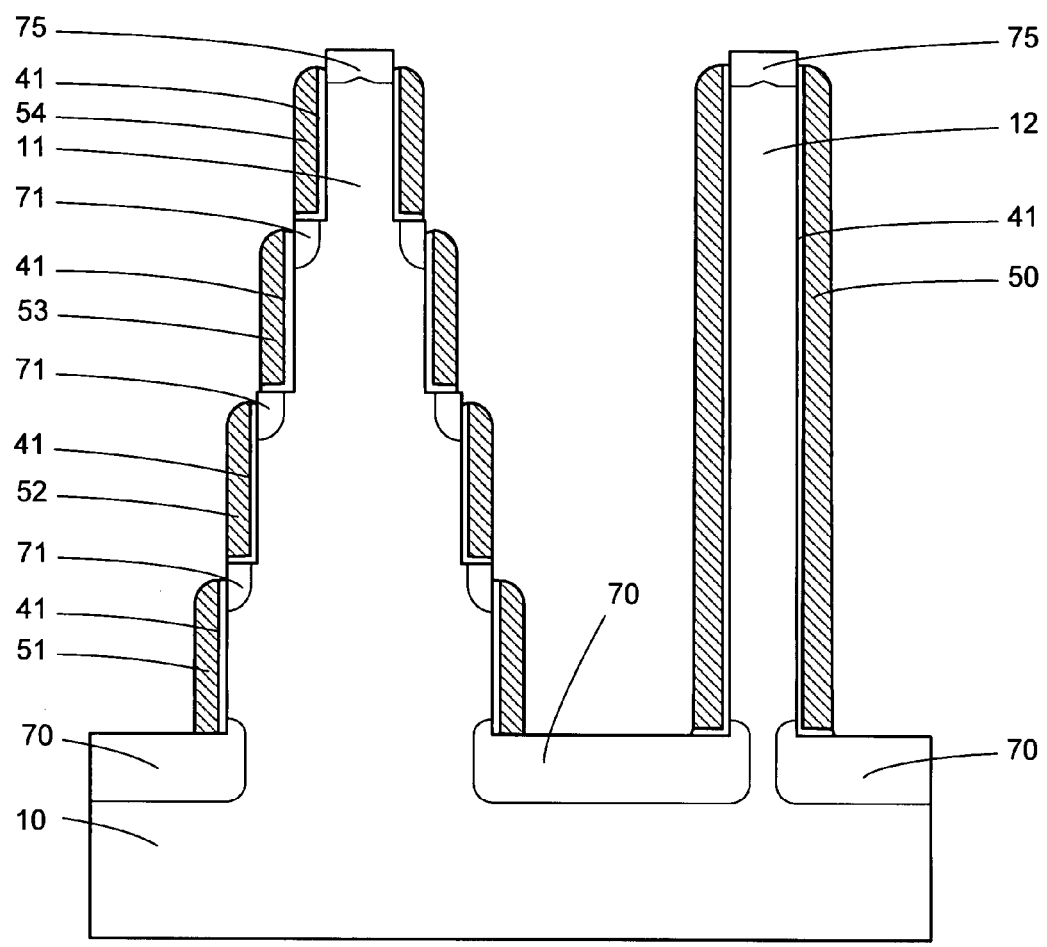
FIG. 27 is a cross section showing the example of the manufacturing process of the semiconductor device of the invention (second embodiment).

The semiconductor device shown in FIG. 27 which is manufactured by the above-described processes has transistors using the polysilicon films 50 to 54 as gates in the parts in the side walls of the first and second island-shaped semiconductor layers 11 and 12. The semiconductor device shown in FIG. 27 is the same semiconductor device as that shown in FIG. 1.

After that, by performing connecting operation so as to obtain an electrically desired function using a known technique, the semiconductor device can be completed.

Through the manufacturing processes, the semiconductor device having plural kinds of island-shaped semiconductor layers which are different from one another with respect to the number of steps in the side walls or the presence/absence of a step is obtained.

Although the simplified semiconductor device having two island-shaped semiconductor layers has been described as an example for easier understanding in the embodiment, each of the two kinds of island-shaped semiconductor layers may be singular or plural.

As in the embodiment, transistors whose channel lengths are different from one another are formed on the side walls of different kinds of island-shaped semiconductor layers. For example, a transistor formed in the second island-shaped semiconductor layer 12 in the embodiment can be used as a transistor requiring high withstand voltage, and a transistor formed in the first island-shaped semiconductor layer 11 can be used for a part requiring high packing density. As compared with a conventional semiconductor device having only one kind of island-shaped semiconductor layers, the semiconductor device having a high degree of freedom in circuit design can be manufactured.

The combination of elements formed in the island-shaped semiconductor layers whose side wall shapes are different from one another is not limited to a combination of transistors. For example, memory cells, capacitors, diodes, and the like can be formed. Since the semiconductor device of the invention can be manufactured by combining various kinds of elements, the degree of freedom in circuit design is higher than that of the conventional semiconductor devices.

In a conventional semiconductor device formed by only the same kind of island-shaped semiconductor layers, for example, evaluations of the characteristics of a gate insulation film formed on the side wall of an island-shaped semiconductor layer include an evaluation of a characteristic that a step does not contribute to anything. In this case, by forming an island-shaped semiconductor layer having no steps in the TEG part, the desired characteristic evaluation can be performed. According to the method for manufacturing the semiconductor device of the invention, step portions having different side wall shapes can be formed in the same semiconductor device. Therefore, the very useful semiconductor device having a high degree of freedom in design can be obtained.

Third Embodiment

In a semiconductor device of a third embodiment, the first and second island-shaped semiconductor layers are different in the number of steps in island-shaped semiconductor layers on which elements are formed. Processes for manufacturing the semiconductor device of the third embodiment will be described. FIGS. 28 to 32 are cross sections showing another example of the manufacturing process of the semiconductor device of the invention.

The silicon nitride film 31 is formed into sidewalls on the side walls of the first and second island-shaped layers 11 and 12 in a manner similar to those shown in FIGS. 1 to 7 or FIG. 8 in the foregoing second embodiment.

Figure 28:
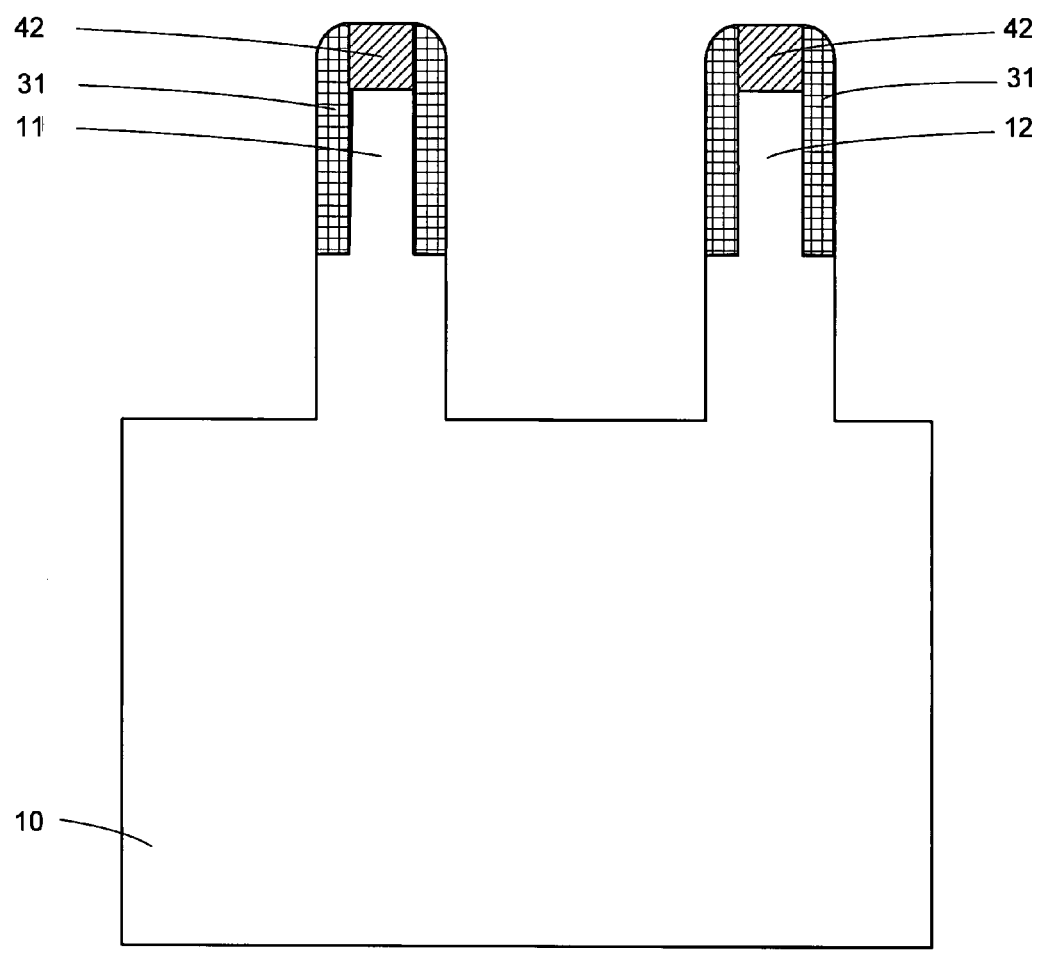
FIG. 28 is a cross section showing another example of the manufacturing process of the semiconductor device of the invention (third embodiment).

Subsequently, by using the sidewall-shaped silicon nitride films 31 formed on the side walls of the first and second island-shaped semiconductor layers 11 and 12 as a mask, the substrate 10 is etched to a depth of 50 to 5000 nm. In the third embodiment, different from the second embodiment, the etching is performed so as to leave the silicon nitride films 31 on the sidewall also on the side wall of the island-shaped semiconductor layer 12 (FIG. 28). In such a manner, a step is formed also in the side wall of the island-shaped semiconductor layer 12.

Figure 29:
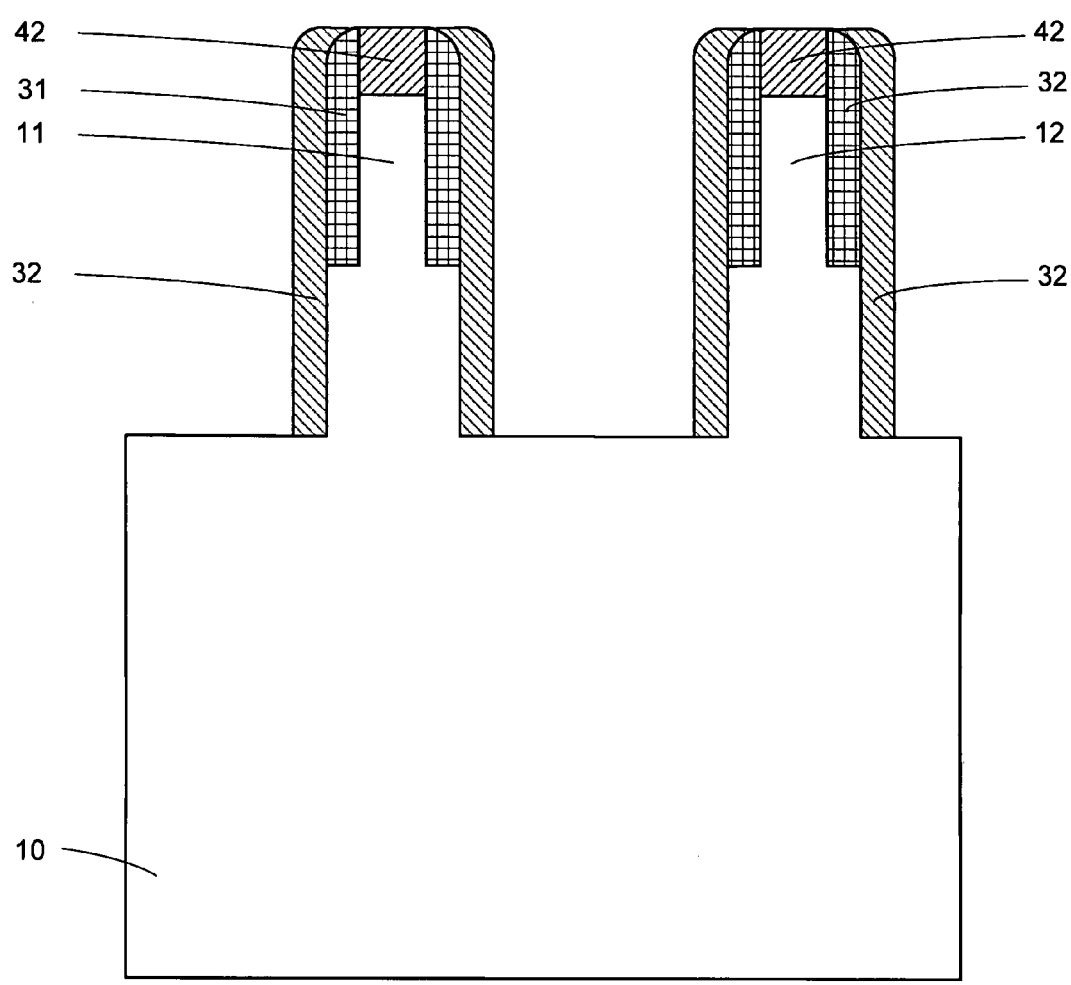
FIG. 29 is a cross section showing the another example of the manufacturing process of the semiconductor device of the invention (third embodiment).

Next, the silicon nitride film 32 as a fourth insulation film is deposited to 10 to 1000 nm. By anisotropic etching, the silicon nitride film 32 is processed for shaping sidewalls on the silicon oxide film 42, the silicon nitride film 31, and the side walls of the first and second island-shaped semiconductor layers 11 and 12 (FIG. 29).

Figure 30:
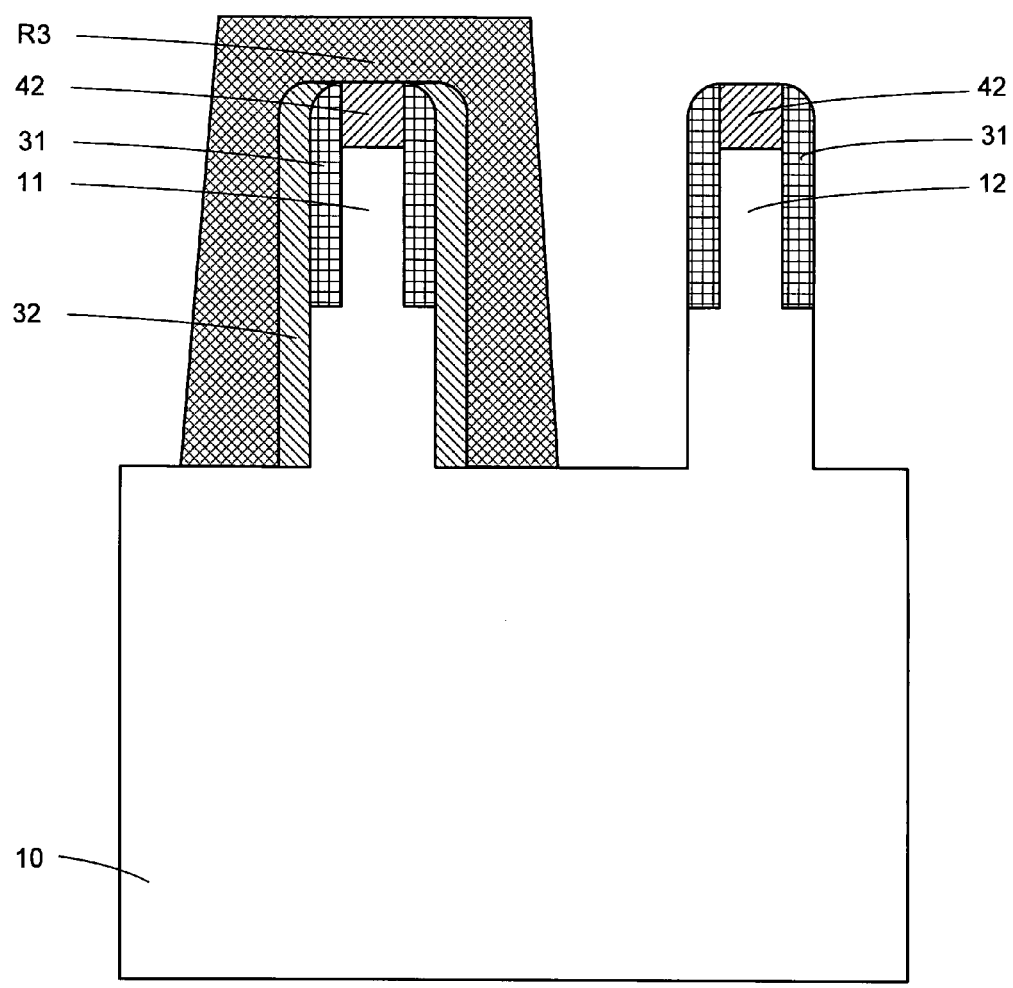
FIG. 30 is a cross section showing the another example of the manufacturing process of the semiconductor device of the invention (third embodiment).

Further, the island-shaped semiconductor layer 11 in which a step is to be formed is covered with a resist R3. By using known photolithography, the silicon nitride film 32 formed on the side wall of the second island-shaped semiconductor layer 12 is removed by applying isotropic etching (FIG. 30).

Figure 31:
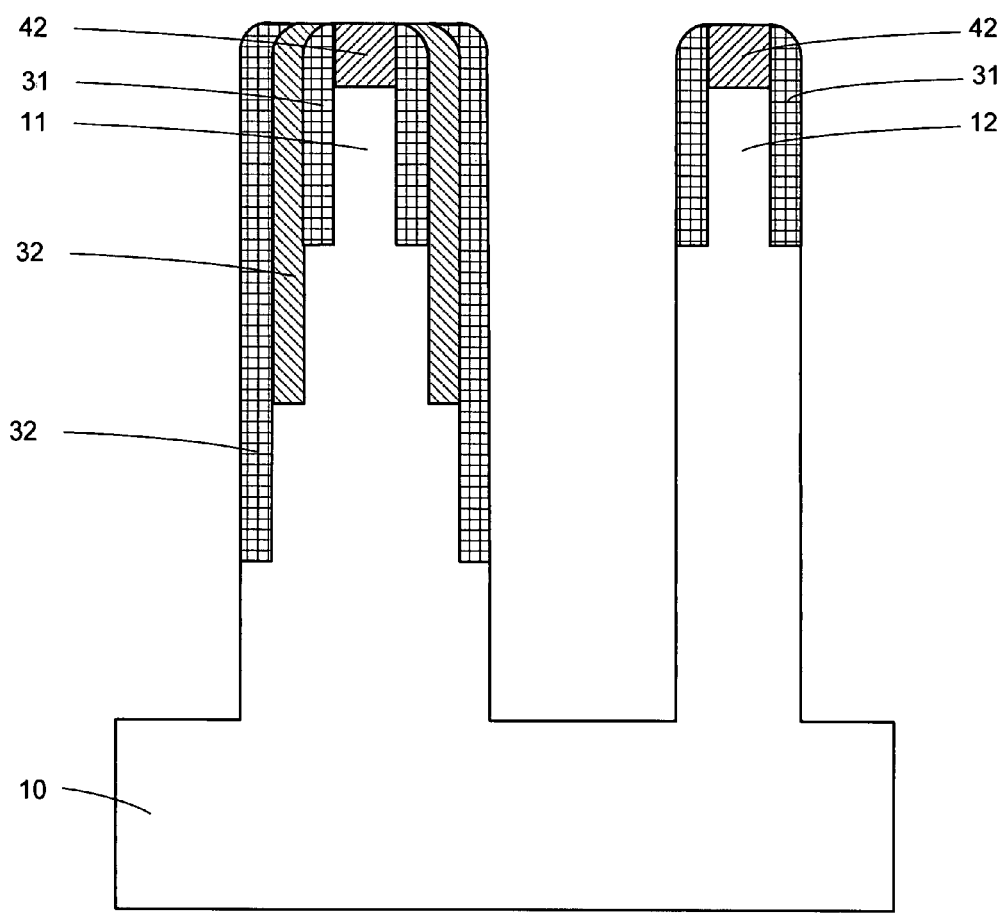
FIG. 31 is a cross section showing the another example of the manufacturing process of the semiconductor device of the invention (third embodiment).

After that, by performing the manufacturing processes of FIGS. 12 to 21 in the second embodiment, the semiconductor device including the first island-shaped semiconductor layer 11 having three steps and the second island-shaped semiconductor layer 12 having only one step can be manufactured (FIG. 31).

In the example of the manufacturing process, although the first island-shaped semiconductor layer 11 in which the number of steps in the side wall is three is shown, the number of the steps in the side wall is not limited to three. The number of steps may be one, two, or four or more.

Figure 32:
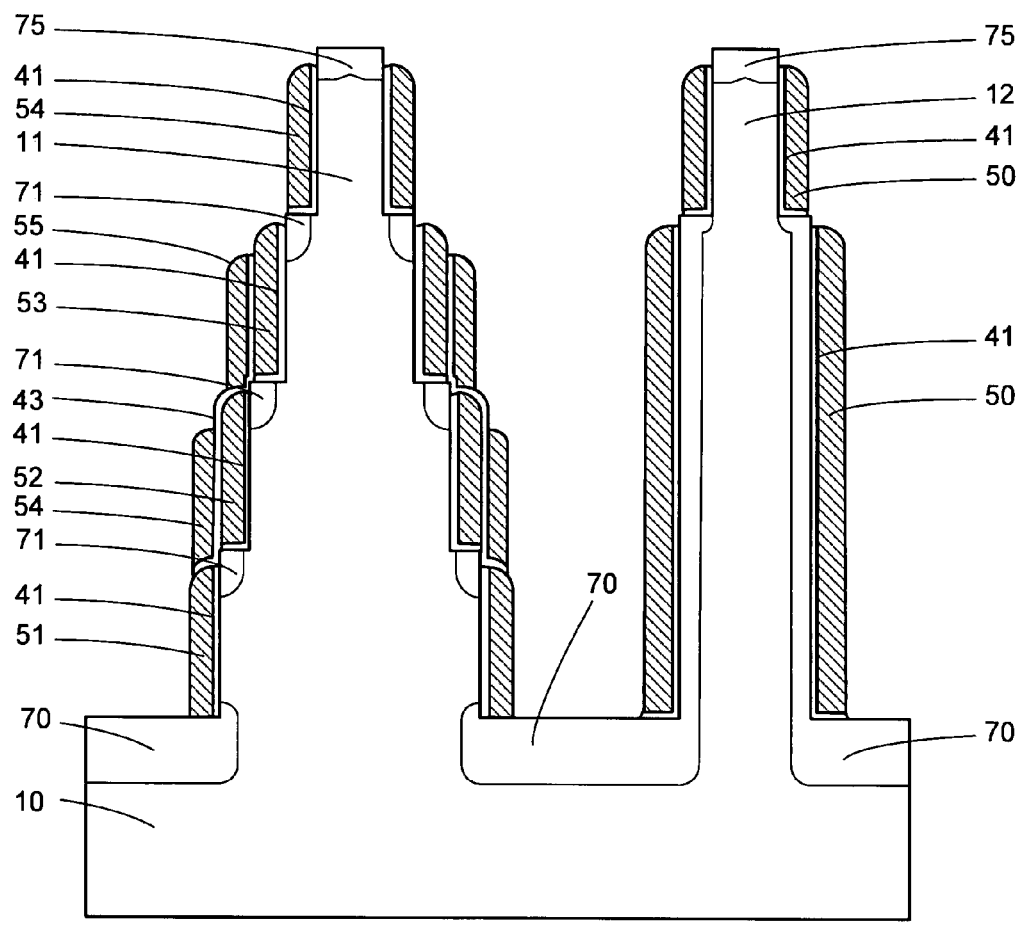
FIG. 32 is a cross section showing the another example of the manufacturing process of the semiconductor device of the invention (third embodiment).

After that, processes similar to the manufacturing processes shown in FIGS. 22 to 27 of the foregoing second embodiment are performed, and known processes for forming the silicon oxide film 43 and the polysilicon films 54 and 55 are formed. As a result, the semiconductor device including the first island-shaped semiconductor layer 11 having three steps and the second island-shaped semiconductor layer 12 having one step can be manufactured (FIG. 32).

In the third embodiment, a capacitor is formed in the lower part of the side wall of the second island-shaped semiconductor layer 12. The capacitor uses the silicon oxide film 41 as a dielectric film and uses, as electrodes, the polysilicon film 50 and the impurity diffusion layer 70 formed under the side walls of the island-shaped semiconductor 12. The impurity diffusion layer 70 can be formed by exposing a region in which the impurity diffusion layer 70 is to be formed by, for example, the known photolithography, CVD, or etching process and, after that, performing the ion implantation process and thermal diffusion process.

In a manner similar to the manufacturing process example of the second embodiment, the first island-shaped semiconductor layer and/or the second island-shaped semiconductor layer may be plural layers. Further, the combination of elements formed in the first and second island-shaped semiconductor layers is not limited to a combination of transistors. For example, memory cells, capacitors, diodes, and the like can be formed.

As an example of forming a diode, an impurity diffusion layer 75 to be formed on the island-shaped semiconductor layer 12 is formed as an impurity diffusion layer of the same conductive type as that of the island-shaped semiconductor layer 12 by using the known photolithography, implantation, and annealing. In such a manner, a diode can be obtained between the impurity diffusion layer 70 and the island-shaped semiconductor layer.

By combining the manufacturing process of the second embodiment and that of the third embodiment, a semiconductor device having a high degree of freedom in circuit design or the configuration of the TEG part can be obtained.

Fourth Embodiment

In a semiconductor device of a fourth embodiment, the height of the side wall of a first island-shaped semiconductor layer in which an element is formed and that in a second island-shaped semiconductor layer are different from each other. Processes for manufacturing the semiconductor device of the fourth embodiment will be described. FIGS. 33 to 36 are cross sections showing another example of the manufacturing process of the semiconductor device of the invention.

The silicon nitride film 31 is formed into sidewalls on the side walls of the first and second island-shaped layers 11 and 12 in a manner similar to those shown in FIGS. 1 to 7 or FIG. 8 in the foregoing second embodiment.

Figure 33:
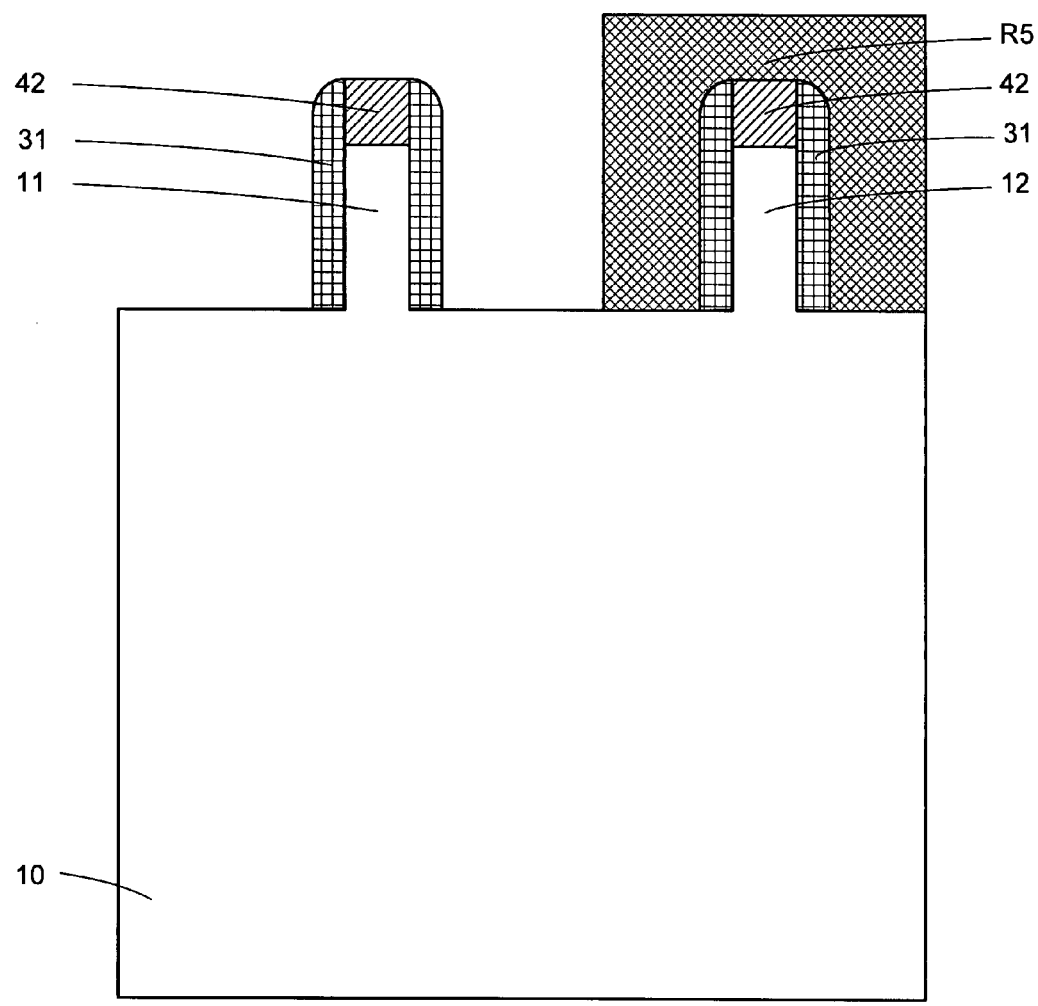
FIG. 33 is a cross section showing a further another example of the manufacturing process of the semiconductor device of the invention (fourth embodiment).

Subsequently, the second island-shaped semiconductor layer 12 whose height is not further increased is covered with a resist R5 by the known photolithography, and the first island-shaped semiconductor layer 11 in which a step is formed is exposed (FIG. 33).

Figure 34:
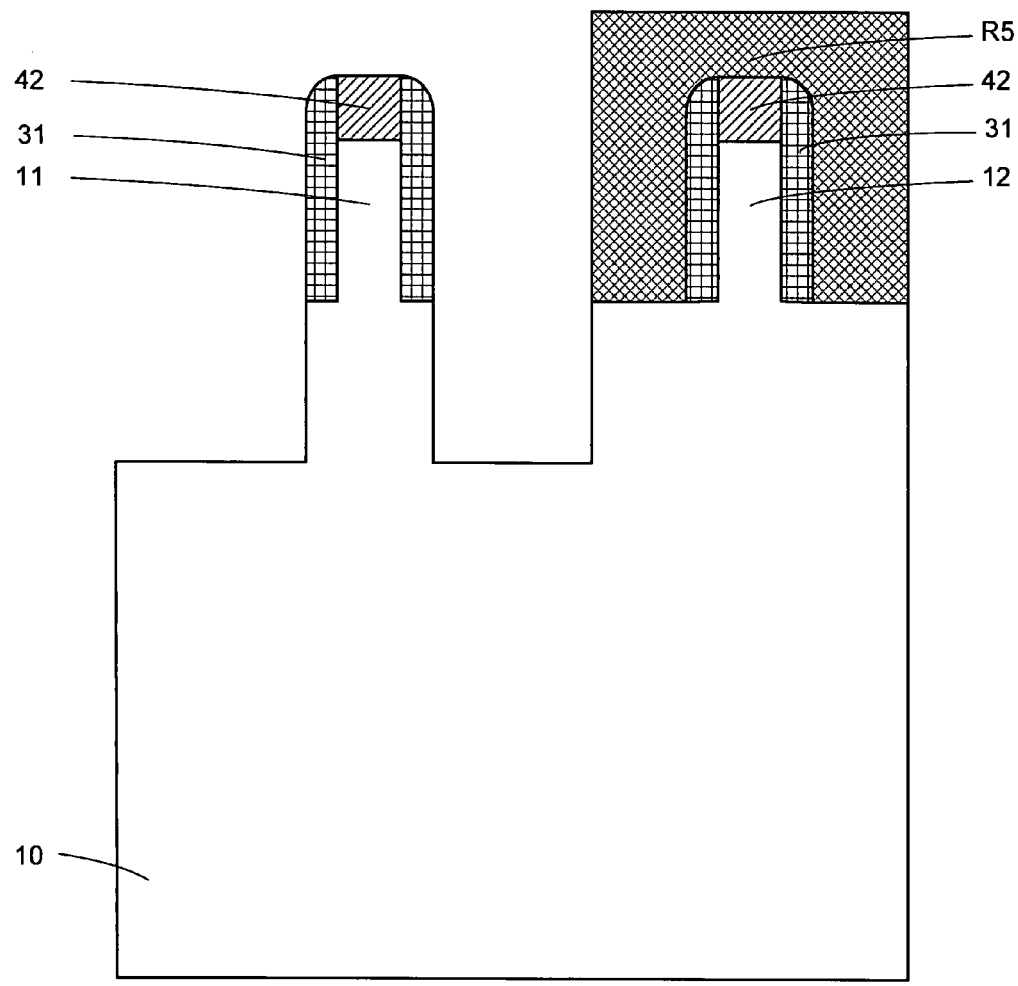
FIG. 34 is a cross section showing the further another example of the manufacturing process of the semiconductor device of the invention (fourth embodiment).

With the sidewall-shaped silicon nitride film 31 and the resist R5 as a mask, the surface of the substrate 10 is etched to a depth of 50 to 5000 nm. As a result, the first island-shaped semiconductor layer 11 having one step and the second island-shaped semiconductor layer 12 having no steps are formed (FIG. 34).

Figure 35:
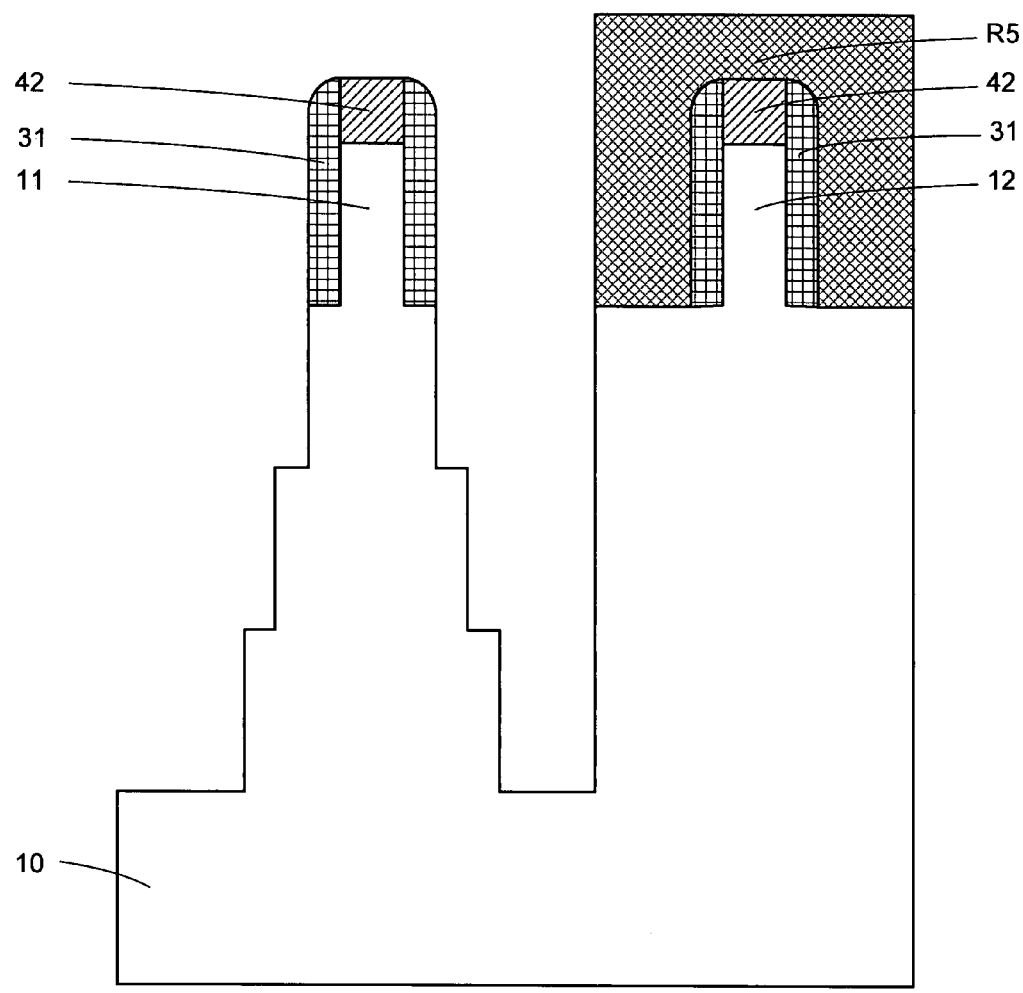
FIG. 35 is a cross section showing the further another example of the manufacturing process of the semiconductor device of the invention (fourth embodiment).

Further, with the second island-shaped semiconductor layer 12 covered with the resist R2, the process of etching the substrate 10 while forming a step in the side wall is repeated on the first island-shaped semiconductor layer 11, thereby obtaining the semiconductor device shown in FIG. 35. The process is similar to that in FIGS. 12, 13, 16, 17, 18, and 21 of the foregoing second embodiment except for the point that the second island-shaped semiconductor layer 12 is covered with the resist R5.

Although the first island-shaped semiconductor layer 11 in which the number of steps in the side wall is three is shown in the manufacture process of the fourth embodiment, the number of steps in the side wall is not limited to three but may be one, two, or four or more.

After that, by manufacturing processes similar to those of FIGS. 22 to 27 of the second embodiment, the semiconductor device including the first island-shaped semiconductor layer 11 whose side wall has steps and the second island-shaped semiconductor layer 12 whose side wall has a height different from that of the first island-shaped semiconductor layer 11 can be manufactured (FIG. 36).

Like the second embodiment, the first island-shaped semiconductor layer and/or the second island-shaped semiconductor layer may be plural layers. Further, elements formed in the first and second island-shaped semiconductor layers are not limited to transistors but may be, for example, memory cells, capacitors, diodes, and the like.

By combining the manufacturing process of the second embodiment and/or the third embodiment and the manufacturing process of the fourth embodiment, a semiconductor device having a high degree of freedom in circuit design or the configuration of the TEG part can be obtained.

Fifth Embodiment

A fifth embodiment of the invention will be described with reference to FIG. 37. The semiconductor memory device or the semiconductor device in the foregoing embodiments can be used for a battery-driven portable electronic device, especially, a portable information terminal. The portable electronic device is a portable information terminal, a cellular phone, a game device, or the like.

Figure 37:
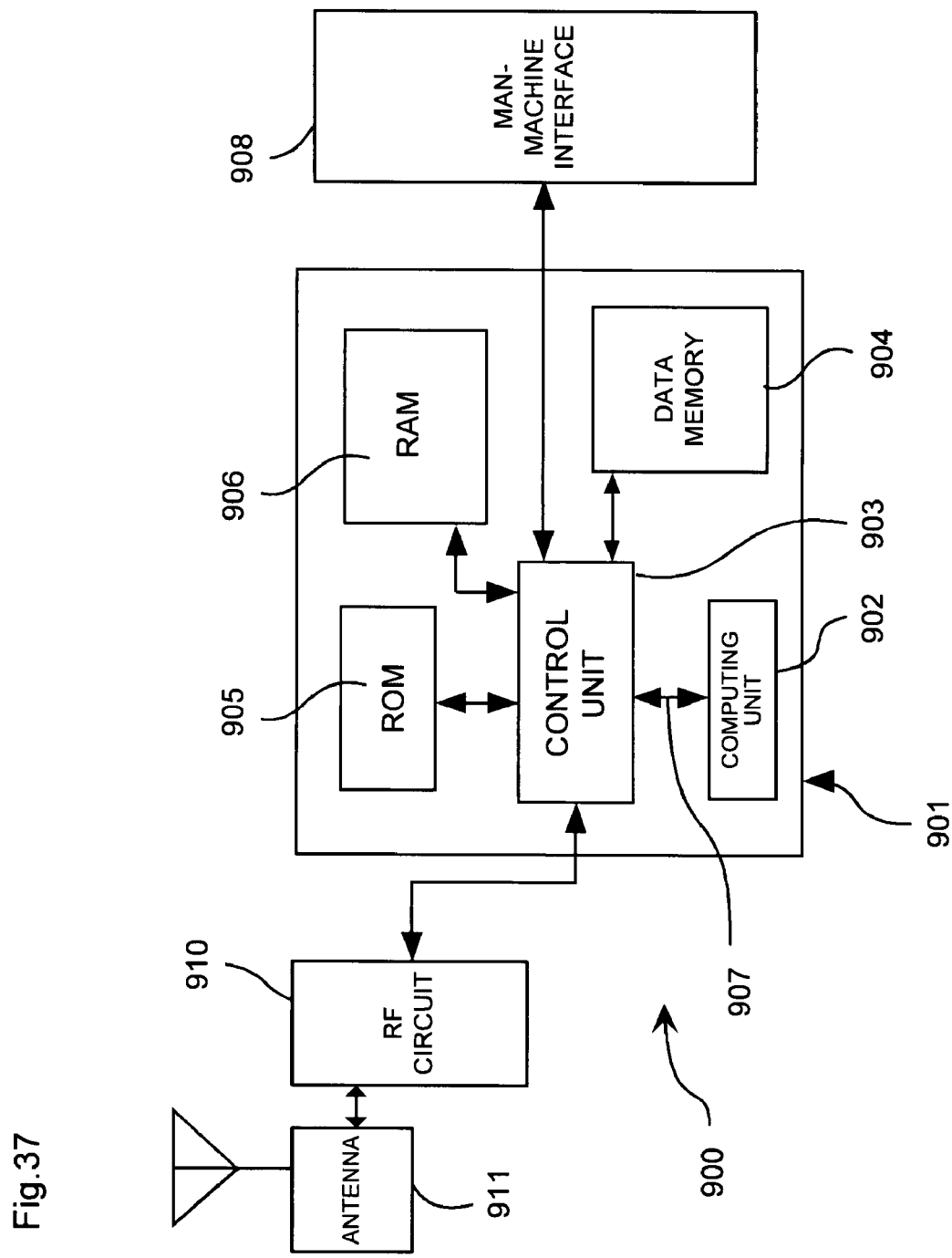
FIG. 37 is a block diagram showing an example of a cellular phone as an embodiment of a portable electronic device using the semiconductor device of the invention (fifth embodiment).

FIG. 37 shows an example of a cellular phone. The semiconductor device of the invention is assembled in the cellular phone.

By using the semiconductor device of the invention for the cellular phone, the circuit can be miniaturized. Alternatively, by increasing the capacity of a nonvolatile memory included in the circuit, the function of the portable electronic device can be improved.

As shown in FIG. 37, a cellular phone 900 has therein a control circuit section 901, a man-machine interface section 908, a radio frequency (RF) circuit section 910, and an antenna section 911. The control circuit section 901 has therein a data memory section 904, a computing section 902, a control section 903, a ROM 905, and a RAM 906. The components are connected via lines 907 (including a data bus and a power line).

In the semiconductor device of the invention, the degree of design freedom of elements mounted in the semiconductor device and circuit configurations is high. Therefore, various circuits except for memories, such as the computing section 902 and the control section 903 can be easily mounted in a single semiconductor device. The area of a chip is used more effectively as compared with a semiconductor device in which elements are disposed on the surface. Accordingly, the capacity of the memory can be increased. In the case where the memory capacity is unchanged, the chip occupation area is reduced, and miniaturization of the semiconductor device can be realized. By using the semiconductor device for the data memory section 904 or the like in the cellular phone 900, the cellular phone 900 can be miniaturized.

In the embodiment, the data memory section 904, the computing section 902, the control section 903, the ROM 905, and the RAM 906 in the control circuit section 901 are formed on one chip using the semiconductor device of the invention. Therefore, it can be also expected to obtain an effect of reduction in cost realized by forming the control circuit 901 including the data memory section 904, the ROM 905, and RAM 906 on one chip.

The invention claimed is:

1. A semiconductor device comprising:
    two or more island-shaped semiconductor layers including first and second island-shaped semiconductor layers formed on the same substrate,
    wherein at least the first island-shaped semiconductor layer has steps in its sidewall so that sectional area of a cross section parallel to the surface of the substrate varies stepwise with respect to height in the vertical direction,
    the second island-shaped semiconductor layer is different from the first island-shaped semiconductor layer with respect to the presence/absence of a step in the sidewall or the number of steps, and
    each of the first and second island-shaped semiconductor layers provides an element on a stair part of the sidewall divided by the steps or on the sidewall having no steps.

2. A semiconductor device comprising:
    two or more island-shaped semiconductor layers including first and second island-shaped semiconductor layers formed on the same substrate,
    wherein at least the first island-shaped semiconductor layer has steps in its sidewall so that sectional area of a cross section parallel to the surface of the substrate varies stepwise with respect to a height in the vertical direction,
    the height of the first island-shaped semiconductor layer and that of the second island-shaped semiconductor layer are different from each other, and
    each of the first and second island-shaped semiconductor layers provides an element on a stair part of the sidewall divided by the steps or on the sidewall having no steps.

3. The semiconductor device according to claim 1 or 2, wherein a combination of elements provided on the sidewall of the first island-shaped semiconductor layer is different from an element or a combination of elements provided on the sidewall of the second island-shaped semiconductor layer.

4. The semiconductor device according to claim 1 or 2, wherein the element is a transistor having, as a gate electrode, an electrode formed to surround entirely or partly the sidewall of the first or second island-shaped semiconductor layer, a capacitor using the electrode as one of electrodes and using an impurity diffusion layer formed on the sidewall across an insulation film as the other electrode, or a memory cell having a charge storage layer and a control gate formed to surround entirely or partly the sidewall of the first or second island-shaped semiconductor layer.

5. The semiconductor device according to claim 1 or 2, wherein the substrate and the first and second island-shaped semiconductor layers include a first region of a first conductive type and a second region made by an impurity diffusion layer of a second conductive type formed at least in a part of the substrate surface, and the element is electrically insulated from the substrate by a depletion layer formed in a joint part between the substrate and the island-shaped semiconductor layer by applying a voltage across the first and second regions.

6. A portable electronic device comprising the semiconductor device according to claim 1 or 2.

7. A method for manufacturing a semiconductor device comprising at least a first island-shaped semiconductor layer having steps in its sidewall, and a second island-shaped semiconductor layer having no steps in its sidewall or having step(s) of the number smaller than that in the first island-shaped semiconductor layer, the first and second island-shaped semiconductor layers being formed on the same substrate, the method comprising:

forming a sidewall on the a wall of each of the first and second island-shaped semiconductor layers;

removing the sidewall on the second island-shaped semiconductor layer prior to the following step in the case of forming no steps in the sidewall; and performing a first etching of the substrate only by a predetermined depth by using, as a mask, the sidewall which is provided at least on the sidewall of the first island-shaped semiconductor layer to form a new sidewall having a step with respect to the already-formed sidewall on the first island-shaped semiconductor layer and to form a new sidewall having a step or no steps with respect to the already-formed sidewall in accordance with the presence or absence of the sidewall on the second island-shaped semiconductor layer.

8. The manufacturing method according to claim 7, further comprising:

performing a second etching of the substrate surface other than the first and second island-shaped semiconductor layers only by a predetermined depth to form the uppermost sidewall of the first island-shaped semiconductor layer and to form a sidewall of the second island-shaped semiconductor layer corresponding to the uppermost sidewall;

after the second etching, repeating the formation of the sidewall, the removal of the sidewall and the first etching in succession only by a predetermined number of times until the predetermined number of steps are formed in the first island-shaped semiconductor layer; and forming an element on a stair part of the sidewall divided by the steps or on the sidewall having no steps, the sidewall being located on each of the island-shaped semiconductor layers, wherein a first island-shaped semiconductor layer having a predetermined number of steps in its sidewall, and a second island-shaped semiconductor layer having no steps in its sidewall or having step(s) of the number smaller than that in the first island-shaped semiconductor layer are formed.

9. The manufacturing method according to claim 7, further comprising:

performing a second etching of the substrate surface other than the first and second island-shaped semiconductor layers only by a predetermined depth to form the uppermost sidewall of the first island-shaped semiconductor layer and a sidewall of the second island-shaped semiconductor layer corresponding to the sidewall;

when a height of the second island-shaped semiconductor layer does not reach a predetermined height after the second etching, repeating the formation of the sidewall, the removal of the sidewall and the first etching until the height of the second island-shaped semiconductor layer reaches the predetermined height;

forming another sidewall on the sidewall of each of the first and second island-shaped semiconductor layers;

covering with a resist the second island-shaped semiconductor layer and an region in the substrate surface including the second island-shaped semiconductor layer;

further etching the substrate only by a predetermined depth using, as a mask, the sidewall provided on the sidewall of the first island-shaped semiconductor layer and the resist to form a new sidewall having a step with respect to the already formed sidewall on the first island-shaped semiconductor layer, but not etching the region which is covered with the resist and includes the second island-shaped semiconductor layer;

when the number of steps in the sidewall of the first island-shaped semiconductor layer does not reach a predetermined number after the further etching, repeating the formation of the another sidewall and the further etching until the number of steps reaches the predetermined number of steps; and forming an element on a stair part of the sidewall divided by the steps in each of the island-shaped semiconductor layers or on the sidewall having no steps, wherein a first island-shaped semiconductor layer having a predetermined number of steps in its sidewall, and a second island-shaped semiconductor layer having no steps in its sidewall or having step(s) of the number smaller than that in the first island-shaped semiconductor layer are formed.

10. The manufacturing method according to claim 8 or 9, wherein the sidewall on the second island-shaped semiconductor layer is removed in all of the sidewall removing steps, thereby forming the sidewall having no steps on the second island-shaped semiconductor layer.

11. The manufacturing method according to claim 8 or 9, wherein the sidewall on the second island-shaped semiconductor layer is not removed in at least one of the sidewall removing steps, thereby forming the sidewall having step(s) of the number smaller than that in the first island-shaped semiconductor layer on the second island-shaped semiconductor layer.

* * * * *